United States Patent
Kimura

(10) Patent No.: US 11,041,888 B2
(45) Date of Patent: Jun. 22, 2021

(54) CURRENT DETECTION CIRCUIT, SEMICONDUCTOR DEVICE AND SEMICONDUCTOR SYSTEM

(71) Applicant: RENESAS ELECTRONICS CORPORATION, Tokyo (JP)

(72) Inventor: Keisuke Kimura, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 244 days.

(21) Appl. No.: 16/251,944

(22) Filed: Jan. 18, 2019

(65) Prior Publication Data
US 2019/0265280 A1    Aug. 29, 2019

(30) Foreign Application Priority Data

Feb. 26, 2018   (JP) .............................. JP2018-031904

(51) Int. Cl.
| | | |
|---|---|---|
| *G01R 31/42* | (2006.01) | |
| *G01R 19/165* | (2006.01) | |
| *H03M 1/46* | (2006.01) | |
| *G05F 3/16* | (2006.01) | |
| *G01R 19/257* | (2006.01) | |

(Continued)

(52) U.S. Cl.
CPC ..... *G01R 19/16519* (2013.01); *G01R 19/257* (2013.01); *G05F 3/16* (2013.01); *H03M 1/468* (2013.01); *H02M 2001/0009* (2013.01); *H03M 1/145* (2013.01)

(58) Field of Classification Search
CPC .... G01R 31/2621; G01R 31/42; G01R 1/203; G01R 15/146; G01R 19/16519; G01R 19/257; G01N 27/025; G01N 27/08; G05F 3/16; H03M 1/468; H03M 1/145; H02M 2001/0009
See application file for complete search history.

(56) References Cited

U.S. PATENT DOCUMENTS

| | | | |
|---|---|---|---|
| 6,559,684 B2 | 5/2003 | Goodfellow et al. | |
| 9,831,771 B2* | 11/2017 | Inoue | ........................ H02P 7/29 |
| 2002/0093325 A1 | 7/2002 | Ju | |

(Continued)

FOREIGN PATENT DOCUMENTS

EP    3 079 161 A1    10/2016

OTHER PUBLICATIONS

Partial European Search Report issued in corresponding European Patent Application No. 19157394.8-1203, dated Jul. 2, 2019.

(Continued)

*Primary Examiner* — Patrick Assouad
*Assistant Examiner* — Taqi R Nasir
(74) *Attorney, Agent, or Firm* — McDermott Will & Emery LLP

(57) ABSTRACT

A current detection circuit, a semiconductor device and a semiconductor system which are capable of improving current detection accuracy are provided. According to one embodiment of the invention, a current detection circuit includes a resistive element to convert an input current supplied from outside into an input voltage, a constant-current source, a resistive element to convert an output current of the constant-current source into a reference voltage, and an AD converter to AD-convert the input voltage using the reference voltage.

19 Claims, 27 Drawing Sheets

(51) Int. Cl.
  *H02M 1/00*  (2006.01)
  *H03M 1/14*  (2006.01)

(56) References Cited

U.S. PATENT DOCUMENTS

| | | | |
|---|---|---|---|
| 2003/0234736 A1* | 12/2003 | Tachibana | H03M 1/68 |
| | | | 341/172 |
| 2004/0189221 A1 | 9/2004 | Kurosawa et al. | |
| 2004/0233093 A1 | 11/2004 | Confalonieri et al. | |
| 2007/0035434 A1* | 2/2007 | Tachibana | H03M 1/468 |
| | | | 341/161 |
| 2010/0085025 A1* | 4/2010 | Kato | H02M 3/157 |
| | | | 323/282 |
| 2011/0121890 A1 | 5/2011 | Kikuchi | |
| 2016/0109488 A1* | 4/2016 | Dearborn | H02M 3/1588 |
| | | | 324/76.11 |
| 2016/0139183 A1* | 5/2016 | Li | H02M 3/158 |
| | | | 324/76.11 |
| 2016/0187386 A1* | 6/2016 | El-Damak | G01R 19/0092 |
| | | | 324/126 |
| 2019/0146014 A1* | 5/2019 | Pohlmann | G01R 19/14 |
| | | | 324/127 |

OTHER PUBLICATIONS

Extended European Search Report issued in corresponding European Patent Application No. 19157394.8-1203, dated Oct. 2, 2019.

\* cited by examiner

CURRENT DETECTION CIRCUIT, SEMICONDUCTOR DEVICE AND SEMICONDUCTOR SYSTEM

CROSS-REFERENCE TO RELATED APPLICATIONS

The disclosure of Japanese Patent Application No. 2018-031904 filed on Feb. 26, 2018 including the specification, drawings and abstract is incorporated herein by reference in its entirety.

BACKGROUND

The present invention relates to a current detection circuit, a semiconductor device and a semiconductor system, for example, a current detection circuit, a semiconductor device and a semiconductor system which are suitable for improving current detection accuracy.

Automobiles are each mounted with an electronic control unit which controls the current supply to a solenoid valve for controlling opening and closing of a clutch. The electronic control unit transmits the driving force of an engine to a transmission or cuts off the driving force when the automobile is started or stopped or when its speed is changed. For this, the electronic control unit controls opening and closing of the clutch by controlling the current supply to the solenoid valve. The electronic control unit is required to accurately open and close the clutch by accurately controlling the current supply to the solenoid valve.

Hence, the electronic control unit includes a current detection circuit to determine whether the value of current outputted from a solenoid driver is normal. Naturally, the current detection circuit is required to detect the current with high accuracy.

A type of current detection circuit in which the current flowing through a driver is detected using a shunt resistor is known as a high-accuracy current detection circuit. Such a current detection circuit using a shunt resistor, however, poses a problem of circuit scale enlargement. Particularly, when it is necessary to mount plural solenoid drivers over a single chip, plural current detection circuits each including a shunt resistor are formed over the single chip and this makes the chip very large.

A measure addressing such a problem is disclosed in U.S. Pat. No. 6,559,684. In the patent literature, a current detection circuit configuration is disclosed in which, by detecting a current proportional to a current flowing through a driver (transistor) using a sense transistor, the current flowing through the driver is indirectly detected. This configuration suppresses circuit scale enlargement compared with when a shunt-resistor type current detection circuit is used.

SUMMARY

In the current detection circuit disclosed in the above patent literature, a current flowing through a sense transistor is converted into an analog input voltage using a resistive element, then the analog input voltage is converted into a digital signal using an AD converter. Generally, for example, a successive-approximation AD converter requires, in order to realize AD conversion, a reference voltage corresponding to a full-scale range. In the above patent literature, however, how to generate a reference voltage is neither disclosed nor suggested. Therefore, it is possible that, in the configuration disclosed in the above patent literature, a desired reference voltage cannot be accurately generated. This follows that the current detection circuit described in the above patent literature cannot accurately perform AD conversion and that the accuracy of current detection is low. Other objects and novel features will become apparent from the following description of this specification and the accompanying drawings.

According to an embodiment of the present invention, a semiconductor device includes a first resistive element which converts an input current supplied from outside into an input voltage, a first constant-current source, a second resistive element which converts an output current of the first constant-current source into a reference voltage, and an AD converter which AD-converts the input voltage using the reference voltage.

According to the above embodiment, a current detection circuit, a semiconductor device and a semiconductor system which are capable of improving current detection accuracy can be provided.

BRIEF DESCRIPTION OF THE DRAWINGS

FIG. 4 is a diagram describing a current flow in the current detection unit when a high-side driver is on.

FIG. 5 is a diagram for describing a current flow in the current detection unit when a low-side driver is on.

DETAILED DESCRIPTION

Figure 1:
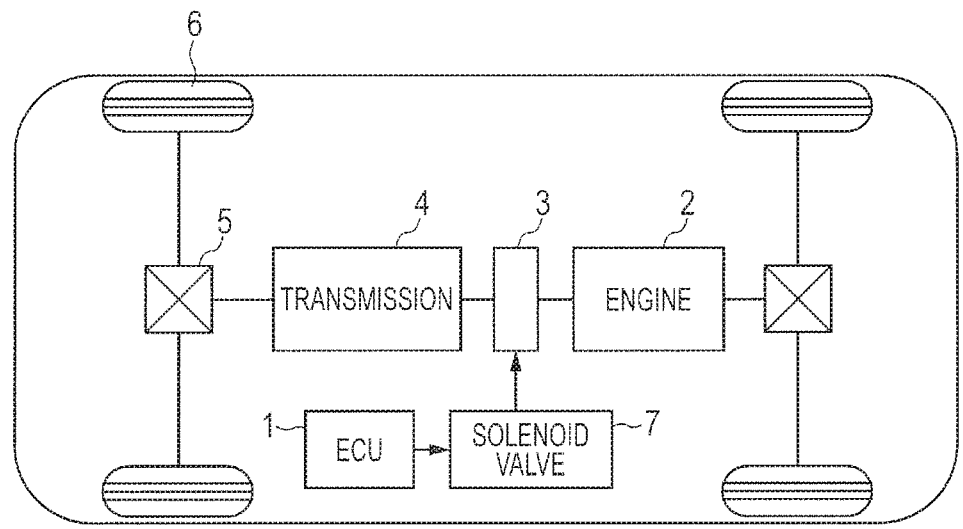
FIG. 1 is an external view of an automobile mounted with an ECU (Electronic Control Unit) according to a first embodiment of the present invention.

The following description and the drawings referred to in the following include omissions and simplification as appropriate to make description clear. Also, elements represented in drawings as function blocks to perform various processing can be realized hardware-wise with a CPU (Central Processing Unit), a memory and other circuits or software-wise with, for example, programs loaded in memory. Therefore, it will be understood by those skilled in the art that such function blocks can be realized in various ways, for example, by hardware means only or by software means only or by combining hardware means and software means without being limited to any particular means. Also, in the drawings referred to in the following, identical elements are denoted by identical numerals and symbols and, in the description, descriptive duplication is avoided as appropriate.

The programs mentioned above can be stored using various types of non-transitory computer-readable media and can be supplied to a computer. Non-transitory computer-readable media include various types of tangible storage media and may be, for example, magnetic recording media (e.g., flexible disks, magnetic tapes and hard disk drives), magneto-optical media (e.g., magneto-optical disks), CD-ROMs (Read Only Memories), CD-Rs, CD-R/Ws, semiconductor memories (e.g., mask ROMs, PROMs (Programmable ROMs), EPROMs (Erasable PROMs), flash ROMs, and RAMs (Random Access Memories). The programs may be supplied to a computer using various types of transitory computer-readable media. The transitory computer-readable media include, for example, electric signals, optical signals, and electromagnetic waves. The transitory computer-readable media can be used to supply programs to a computer via wired communication channels such as electric wires and optical fibers or via radio channels.

First Embodiment

FIG. 1 is an external view of an automobile mounted with an ECU (Electronic Control Unit) according to a first embodiment of the present invention.

As shown in FIG. 1, the automobile is mounted with, for example, an engine 2, a clutch 3, a transmission 4, a differential gear unit 5, tires 6, a solenoid valve (load) 7 and an ECU (Electronic Control Unit) 1.

The ECU 1 controls current supply to the solenoid valve 7. The solenoid valve 7 converts the current supplied from a solenoid driver into electromagnetic force using, for example, an inductor and controls opening and closing of the clutch 3 using the electromagnetic force. This controls transmission of the driving force of the engine 2 to the transmission 4 when the automobile is started or stopped and when the travel speed of the automobile is changed. The transmission 4 changes the driving force of the engine 2 to drive shaft rotation of a speed and a torque corresponding to the traveling condition of the automobile and transmits the drive shaft rotation to the differential gear 5 to rotate the tires 6.

Figure 2:
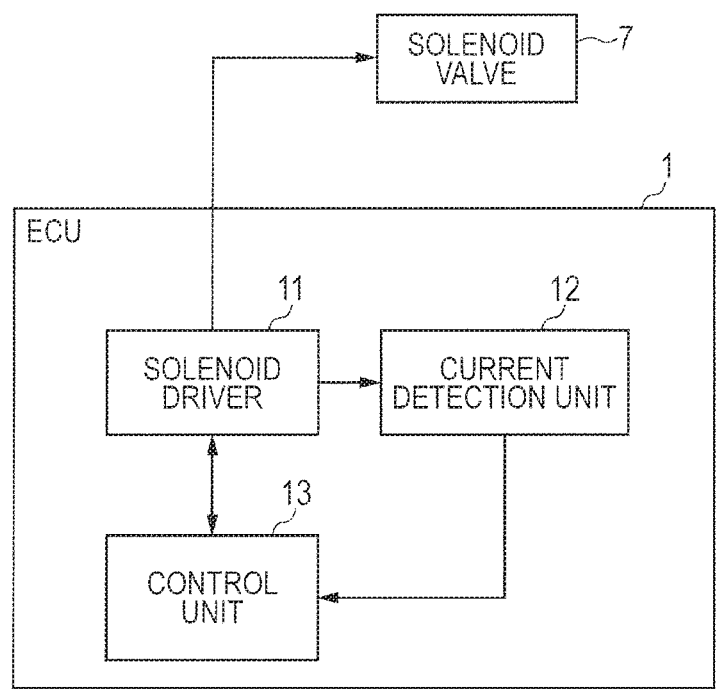
FIG. 2 is a block diagram showing a configuration example of the ECU shown in FIG. 1.

FIG. 2 is a block diagram showing a configuration example of the ECU 1. As shown in FIG. 2, the electronic control unit 1 includes a solenoid driver 11, a current detection unit (a semiconductor device) 12 and a control unit 13.

The solenoid driver 11 outputs a current to the solenoid valve 7. The current detection unit 12 detects the value of the current outputted from the solenoid driver 11. The control unit 13 is, for example, an MCU (Micro-Control Unit) and controls, based on the current value detected by the current detection unit 12, the output current of the solenoid driver 11 to keep the output current in a normal range. This is done, for example, by controlling the duty ratio of a pulse signal used as a control signal.

In the above configuration, the ECU 1 is required to accurately open and close the clutch 3 by accurately controlling the current supply to the solenoid valve 7. Hence, the current detection unit 12 (to be more specific, a current detection circuit 100 included in the current detection unit 12) is required to be capable of current detection with high accuracy.

(Concrete Configuration Example of Current Detection Unit 12)

Figure 3:
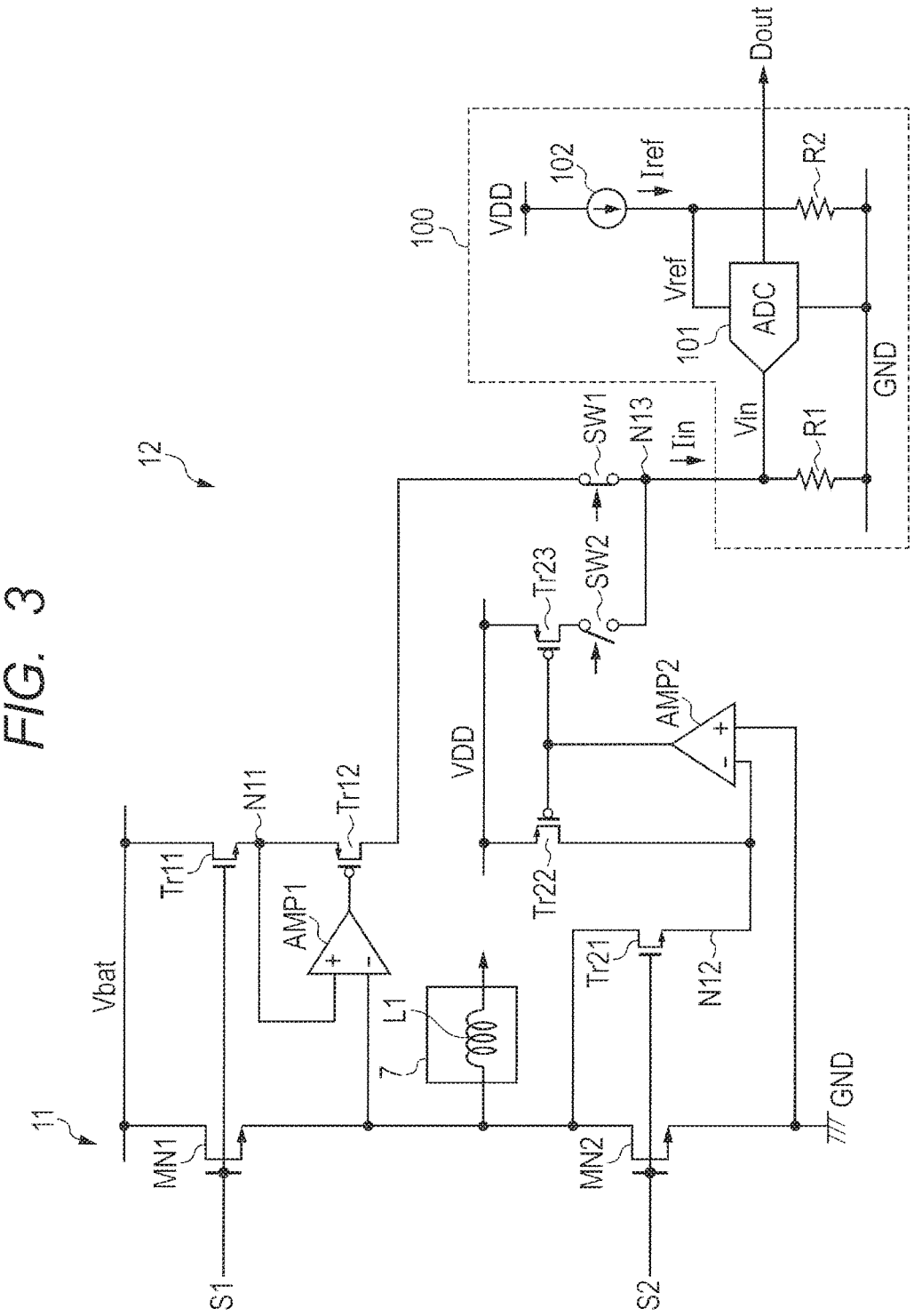
FIG. 3 is a diagram showing a concrete configuration example of a current detection unit included in the ECU shown in FIG. 2.

FIG. 3 is a circuit diagram showing a concrete configuration example of the current detection unit 12. The solenoid driver 11 and the solenoid valve 7 are also shown in FIG. 3.

As shown in FIG. 3, the solenoid driver 11 includes drive transistors MN1 and MN2. The following description of the present embodiment is based on a case in which the drive transistors MN1 and MN2 are N-channel MOS transistors each having a high withstand voltage.

The drive transistor MN1 is positioned between a voltage supply terminal supplied with a battery voltage Vbat (hereinafter referred to as "voltage supply terminal Vbat") and the output terminal of the solenoid driver 11 and turns on/off based on a pulse signal S1 supplied from the control unit 13. The drive transistor MN2 is positioned between a ground voltage terminal GND and the output terminal of the solenoid driver 11 and turns on/off based on a pulse signal S2 which is a control signal supplied from the control unit 13.

For example, first, the drive transistor MN1 turns on and the drive transistor MN2 turns off. This causes a current to flow from the voltage supply terminal Vbat to an inductor L1 of the solenoid valve 7 via the drive transistor MN1. At this time, current energy is accumulated in the inductor L1. Subsequently, the drive transistor MN1 turns off and the drive transistor MN2 turns on. As a result, the current flow from the voltage supply terminal Vbat via the drive transistor MN1 to the inductor L1 of the solenoid valve 7 is shut off. The inductor L1 then releases the current energy accumulated therein so as to maintain the value of the current that was flowing before the current was shut off. This generates a current flow from the ground voltage terminal GND to the inductor L1 of the solenoid valve 7 via the drive transistor MN2. The operation described above is repeated.

The current detection unit 12 includes transistors Tr11 and Tr12, transistors Tr21 to Tr23, operational amplifiers AMP1 and AMP2, switches SW1 and SW2, resistive elements R1 and R2, an AD converter 101, and a constant-current source 102. The resistive elements R1 and R2, AD converter 101 and constant-current source 102 are included in the current detection circuit 100.

The following description of the present embodiment is based on a case in which the transistors Tr12 and Tr22 to Tr23 are P-channel MOS transistors and the transistors Tr11 and Tr21 are N-channel MOS transistors each having a high withstand voltage.

The transistor (sense transistor) Tr11 is positioned between the voltage supply terminal Vbat and a node N11 and turns on/off based on the pulse signal S1. The operational amplifier AMP1 amplifies the potential difference between the source voltage of the drive transistor MN1 and the source voltage of the transistor Tr11 and outputs the amplified potential difference. The transistor Tr12 is positioned between the source of the transistor Tr11 and the switch SW1 and controls its source-drain current based on the output of the operational amplifier AMP1. This causes a current proportional to (e.g., about one-thousandth of) the current flowing through the drive transistor MN1 to flow through the transistor Tr11 (and also through the Tr12).

The transistor (sense transistor) Tr21 is positioned between the output terminal of the solenoid driver 11 (drain of the drive transistor MN2) and a node N12 and turns on/off based on the pulse signal S2. The operational amplifier AMP2 amplifies the potential difference between the source voltage of the drive transistor MN2 and the source voltage of the transistor Tr21 and outputs the amplified potential difference. The transistor Tr22 is positioned between a supply voltage terminal supplied with a supply voltage VDD (hereinafter referred to as a "supply voltage terminal VDD") and the node N12 and controls its source-drain current based on the output of the operational amplifier AMP2. This causes a current proportional to (e.g., about one-thousandth of) the current flowing through the drive transistor MN2 to flow through the transistor Tr21 (and also through the Tr22).

The transistor Tr23 is positioned between the supply voltage terminal VDD and the SW2 and, like the transistor Tr22, controls its source-drain current based on the output of the operation amplifier AMP2. In the present example, a current of the same value as that of the current flowing through the transistor Tr22 flows through the transistor Tr23.

The switches SW1 and SW2 turn on/off in a complementary manner according to the turning on/off of the drive transistors MN1 and MN2.

Figure 4:
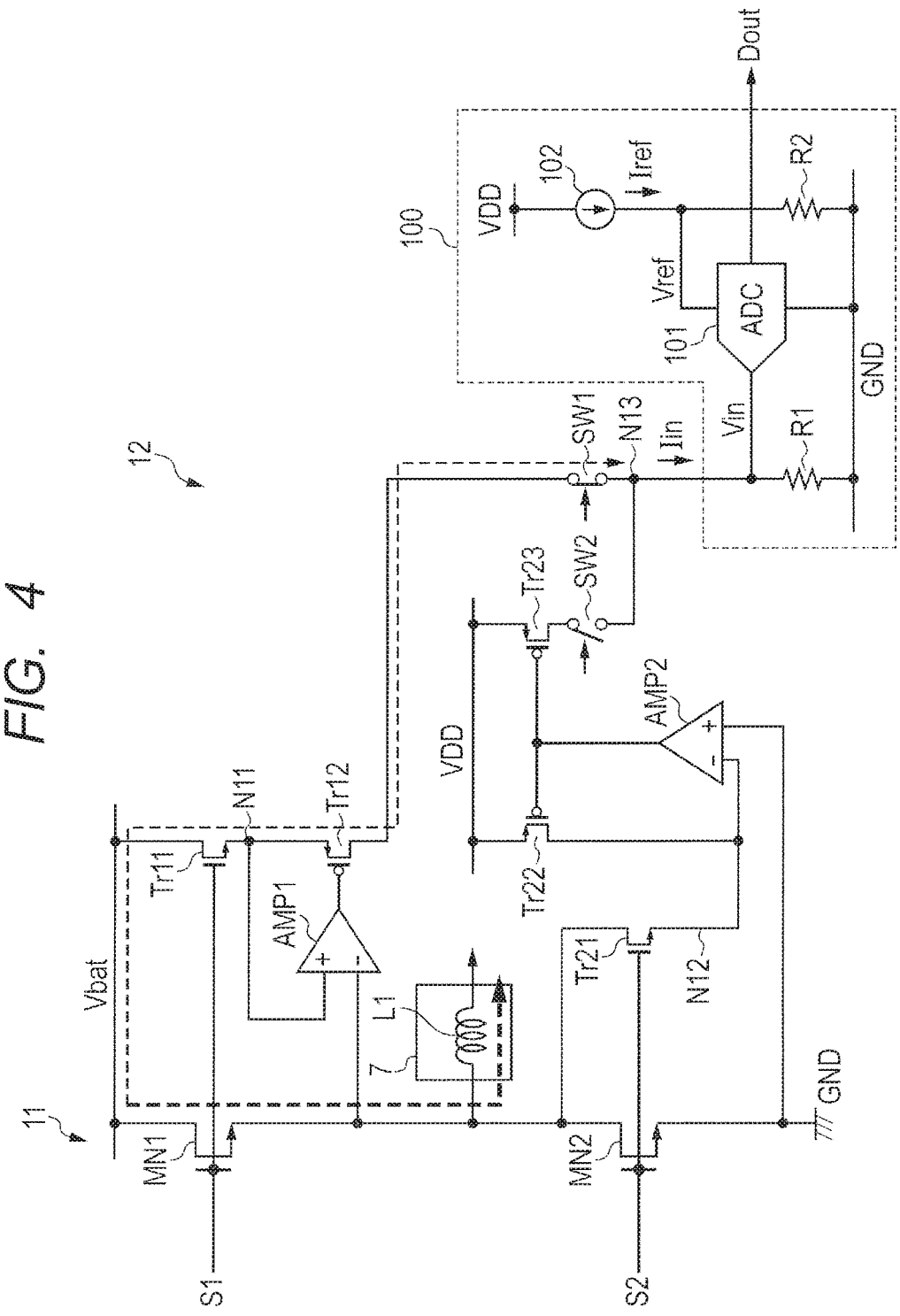

For example, when the drive transistor MN1 turns on and the drive transistor MN2 turns off, the switch SW1 turns on and the switch SW2 turns off. This causes the current that flows through the transistors Tr11 and Tr12 in proportion to the current flowing through the transistor MN1 to flow via the switch SW1 toward the current detection circuit 100 (see FIG. 4).

Figure 5:
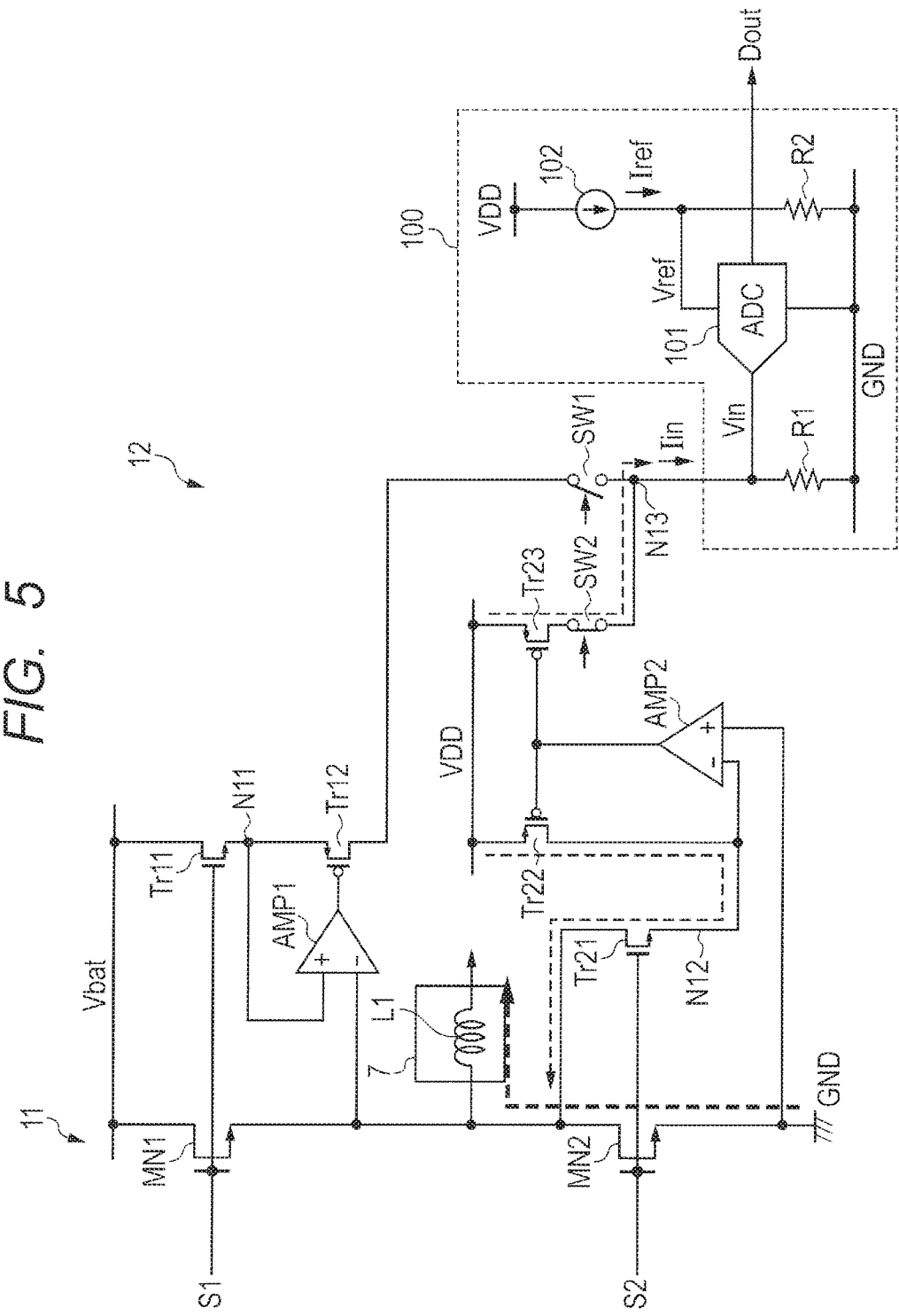

Conversely, when the drive transistor MN1 turns off and the drive transistor MN2 turns on, the switch SW1 turns off and the switch SW2 turns on. This causes the current that flows through the transistors Tr21 and Tr22 in proportion to the current flowing through the drive transistor MN2 to be mirrored by the transistor Tr23 and flow toward the current detection circuit 100 via the switch SW2 (see FIG. 5).

In the current detection circuit 100, the resistive element R1 is positioned between an output node N13 of the switches SW1 and SW2 and the ground voltage terminal GND and converts the current Iin selected, out of the current flowing through the transistor Tr11 and the current flowing through the transistor Tr21, by the switches SW1 and SW2 into an input voltage Vin. The constant-current source 102 is positioned between the supply voltage terminal VDD and the ground voltage terminal GND and outputs a constant current Iref. The resistive element R2 is positioned in series with the constant-current source 102 and converts the constant current Iref into a reference voltage Vref. The AD converter 101 is, for example, a successive-approximation AD converter and AD-converts the input voltage Vin using the reference voltage Vref, then outputs the conversion result (a digital signal) Dout. The digital signal Dout is treated as the value of the current to flow through either one of the drive transistors MN1 and MN2.

(Concrete Configuration Example of AD Converter 101)

Figure 6:
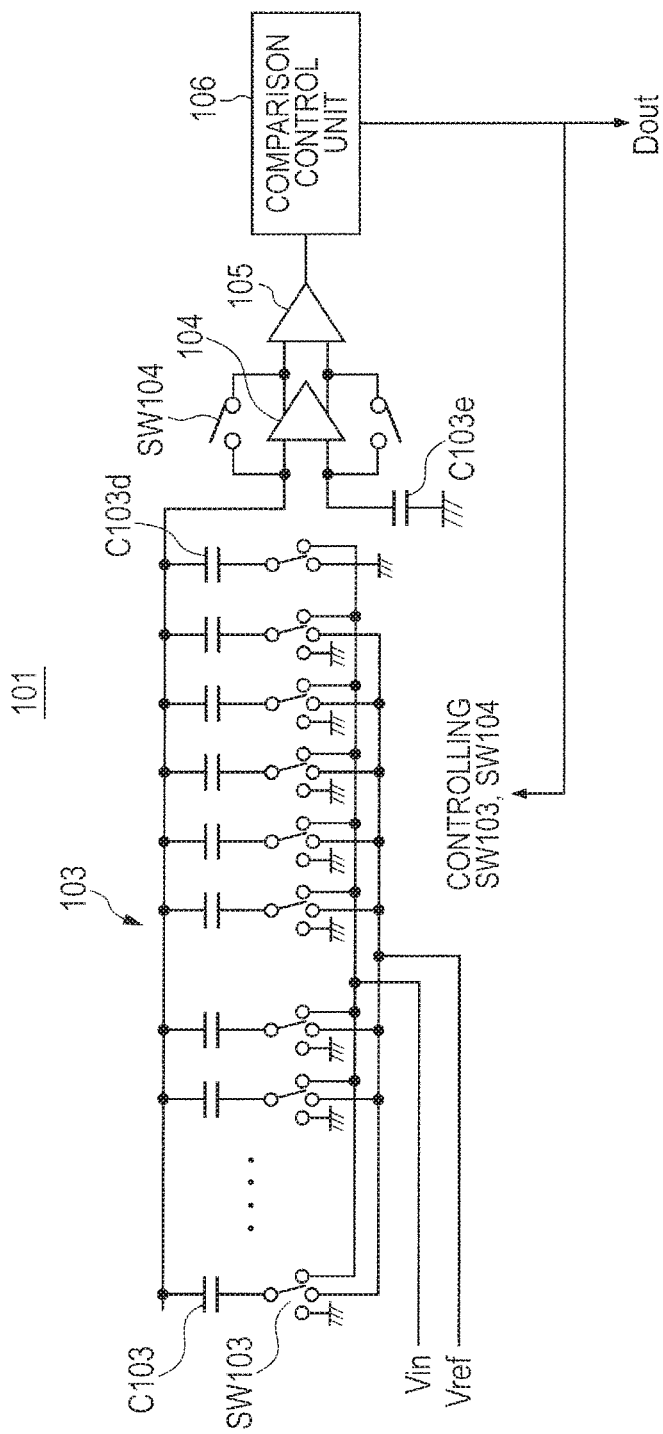
FIG. 6 is a circuit diagram showing a concrete configuration example of an AD converter included in the current detection circuit of the first embodiment.

FIG. 6 is a circuit diagram showing a concrete configuration example of the AD converter 101. The AD converter 101 shown in FIG. 6 is a so-called successive-approximation AD converter.

As shown in FIG. 6, the AD converter 101 includes a DA conversion unit 103, a preamplifier 104, a switch SW104, a comparator 105, a comparison control unit 106, and a capacitor C103e. The DA conversion unit 103 converts digital signals successively outputted from the comparison control unit 106 into analog voltage Vr applying the reference voltage Vref as a full-scale value. The DA conversion unit 103 also has a function to sample and hold the input voltage Vin. The comparator 105 compares the input voltage Vin supplied, via the preamplifier 104, from the DA conversion unit 103 and held by the comparator 105 and the analog voltage Vr and outputs a comparison result. The switch SW104 generates, by short-circuiting the input terminal and output terminal of the preamplifier 104, a voltage Vcm as an output voltage of the preamplifier 104 and applies the voltage Vcm to the input terminal of the preamplifier 104. The comparison control unit 106 outputs, based on the result of the comparison made by the comparator 105, a next digital signal with a different value. Through repetition of this operation, a digital-signal value corresponding to the analog voltage Vr closest in value to the input voltage Vin is determined. The AD converter 101 outputs the digital signal as a conversion result Dout.

To be specific, the DA conversion unit 103 includes a parallel array of plural binary-weighted capacitors C103 with capacitance values binary-weighted from higher-order bits toward lower-order bits and plural switches SW103 provided correspondingly to the capacitors C103. The capacitors C103 include a dummy capacitor C103$d$ with a capacitance equaling the capacitance of the capacitor C103 that corresponds to the lowest-order bit. The turning on/off of the switches SW103 is controlled by the comparison control unit 106 based on the mode of operation and the value of the digital signal to be DA-converted.

For example, in sampling mode, the input voltage Vin is applied to the electrodes on one side of the capacitors C103 and the switch SW104 is turned on, causing the voltage Vcm to be applied to the electrodes on the other side of the capacitors C103. At this time, the capacitor C103$e$ is applied with the voltage Vcm. As a result, the input voltage Vin–the voltage Vcm is sampled at the capacitors C103, whereas the voltage Vcm is sampled at the capacitor C103$e$. Subsequently, in hold mode, the switch SW104 is turned off to put the electrodes on the other side of the capacitors C103 in a floating state and to cause the voltage applied to the electrodes on the one side of the capacitors C103 to be switched from the input voltage Vin to the ground voltage GND. As a result, the input voltage Vin representing the difference between the input voltage Vin–the voltage Vcm sampled at the capacitors C103 and the voltage Vcm sampled at the capacitor C103$e$ is applied as a difference voltage to the differential input terminal of the comparator 105.

Subsequently, the operation mode makes a transition from hold mode to charge redistribution mode. In the charge redistribution mode, first, the voltage applied to the electrode on the one side of the highest-order bit capacitor C103 is changed from the ground voltage GND to the reference voltage Vref. As a result, the differential input terminal of the comparator 105 is applied, for example, with a difference voltage, i. e., –Vin+Vref/2. Based on the result of the comparison made at this time by the comparator 105, the comparison control unit 106 fixes the voltage applied to the electrode on the one side of the highest-order bit capacitor C103 to either the reference voltage Vref or the ground voltage GND. For example, when Vin>Vref/2, the value of the highest-order bit of the digital signal Dout is determined to be 1. In this case, the voltage applied to the electrode on the one side of the highest-order bit capacitor C103 is changed from the reference voltage Vref to the ground voltage GND. When Vin<Vref/2, the value of the highest-order bit of the digital signal Dout is determined to be 0. In this case, the reference voltage Vref is kept applied to the electrode on the one side of the highest-order bit capacitor C103.

Subsequently, the voltage applied to the electrode on the one side of the second-highest-order bit capacitor C103 is changed from the ground voltage GND to the reference voltage Vref. As a result, the differential input terminal of the comparator 105 is applied, for example, with a difference voltage, i. e., –Vin+Vref/2×(value of the highest-order bit)+ Vref/4. Based on the result of the comparison made at this time by the comparator 105, the comparison control unit 106 determines the value of the second-highest-order bit of the digital signal Dout and also fixes the voltage applied to the electrode on the one side of the second-highest-order bit capacitor C103 to either the reference voltage Vref or the ground voltage GND. The value of the digital signal Dout is determined by repeating the above operation in order until the lowest-order bit.

The configurations of the DA conversion unit 103 and the AD converter 101 including the DA conversion unit 103 are not limited to those shown in FIG. 6. Their configurations may be appropriately changed as long as the input voltage Vin can be AD-converted using the reference voltage Vref.

(Concrete Configuration Example of Constant-Current Source 102)

Figure 7:
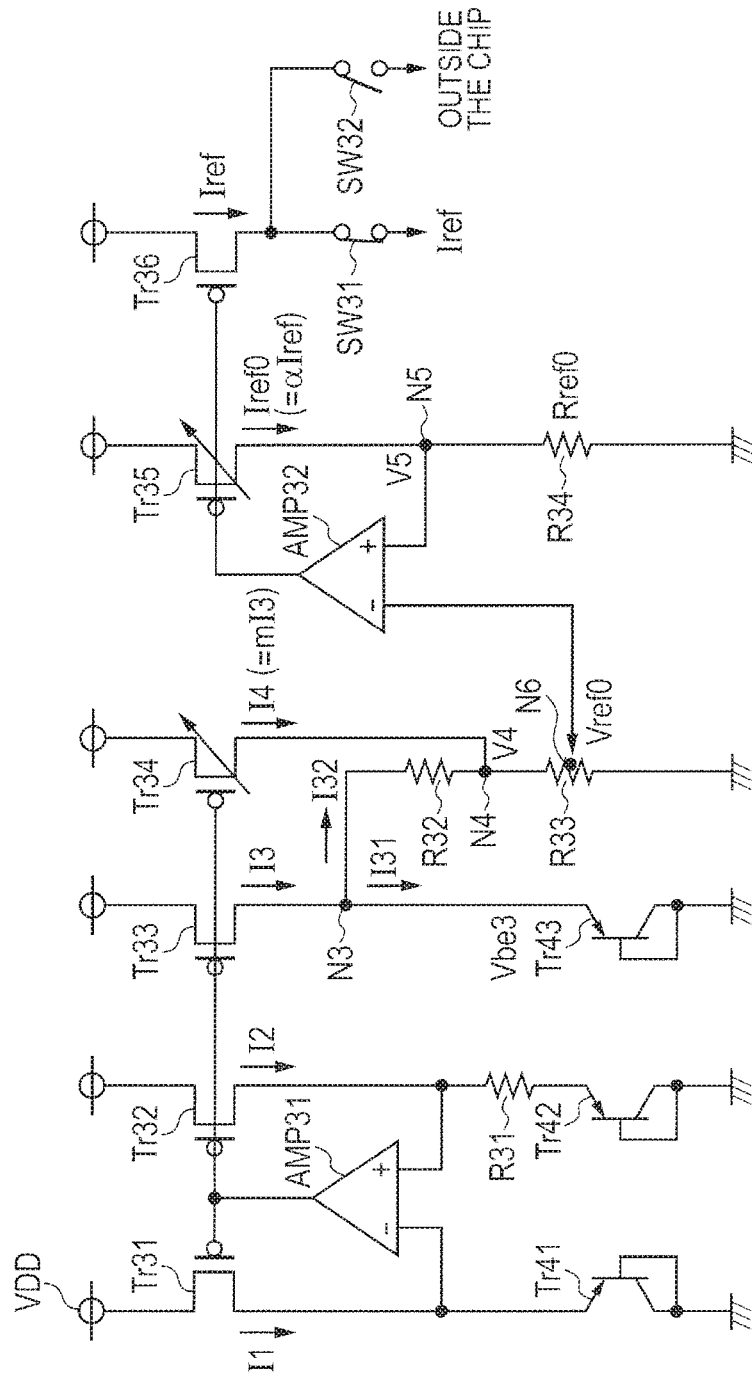
FIG. 7 is a circuit diagram showing a concrete configuration example of a constant-current source included in the current detection circuit of the first embodiment.

FIG. 7 is a circuit diagram showing a concrete configuration example of the constant-current source 102.

As shown in FIG. 7, the constant-current source 102 includes MOS transistors Tr31 to Tr36, bipolar transistors Tr41 to Tr43, resistive elements R31 to R34, operational amplifiers AMP31 and AMP32, and switches SW31 and SW32. The MOS transistors Tr31 to Tr34, bipolar transistors Tr41 to Tr43, resistive elements R31 to R33, and an operational amplifier AMP31 configure a band-gap reference circuit to generate a reference voltage (V4).

The following description of the present embodiment is based on a case in which the MOS transistors Tr31 to Tr36 are all P-channel MOS transistors and the bipolar transistors Tr41 to Tr43 are all PNP-type bipolar transistors.

Of the MOS transistor Tr31, the source is coupled to the supply voltage terminal VDD, the drain is coupled to the emitter of the bipolar transistor Tr41, and the gate is coupled to the output terminal of the operational amplifier AMP31. The base and the collector of the bipolar transistor Tr41 are both coupled to the ground voltage terminal GND.

Of the MOS transistor Tr32, the source is coupled to the supply voltage terminal VDD, the drain is electrically coupled to the emitter of the bipolar transistor Tr42 via the resistive element R31, and the gate is coupled to the output terminal of the operational amplifier AMP31. The base and the collector of the bipolar transistor Tr42 are both coupled to the ground voltage terminal GND.

The operational amplifier AMP31 generates a voltage corresponding to the potential difference between the drain voltage of the MOS transistor Tr31 and the drain voltage of the MOS transistor Tr32 and outputs the generated voltage to the gate of each of the MOS transistors Tr31 to Tr34.

Of the MOS transistor Tr33, the source is coupled to the supply voltage terminal VDD, the drain is coupled to the emitter of the bipolar transistor Tr43 via a node N3, and the gate is coupled to the output terminal of the operational amplifier AMP31. The base and the collector of the bipolar transistor Tr43 are both coupled to the ground voltage terminal GND.

Of the MOS transistor Tr34, the source is coupled to the supply voltage terminal VDD, the drain is coupled to a node N4 (output terminal of a bandgap reference circuit) between the resistive elements R32 and R33, and the gate is coupled to the output terminal of the operational amplifier AMP31. The resistive elements R32 and R33 are coupled in series between the node N3 and the ground voltage terminal GND.

The MOS transistor Tr34 is configured to be capable of adjusting the on resistance. For example, the MOS transistor Tr34 is configured with plural parallel-coupled MOS transistors and plural switches respectively coupled in series to the parallel-coupled MOS transistors and can adjust the source-drain current by controlling turning on/off of the switches. This makes it possible to adjust ratio m of the current flowing through the MOS transistor Tr34 to the current flowing through the MOS transistor Tr33.

Of the MOS transistor Tr35, the source is coupled to the supply voltage terminal VDD, the drain is coupled to the ground voltage terminal GND via the resistive element R34, and the gate is coupled to the output terminal of the operational amplifier AMP 32.

The MOS transistor Tr35 is configured to be capable of adjusting the on resistance. For example, the MOS transistor Tr35 is configured with plural parallel-coupled MOS transistors and plural switches respectively coupled in series to the parallel-coupled MOS transistors and can adjust the source-drain current by controlling turning on/off of the switches. This makes it possible to adjust ratio α of the current flowing through the MOS transistor Tr35 to the current flowing through the MOS transistor Tr36.

The operational amplifier AMP32 generates a voltage corresponding to the potential difference between voltage Vref0 at node N6 whose position is selectable on the resistive element R33 and the drain voltage V5 (voltage at node N5) of the MOS transistor Tr35 and outputs the generated voltage to the gate of each of the MOS transistors Tr35 and Tr36.

Of the MOS transistor Tr36, the source is coupled to the supply voltage terminal VDD, the drain is coupled to the switches SW31 and SW32, and the gate is coupled to the output terminal of the operational amplifier 32. The current Iref flowing through the MOS transistor Tr36 is outputted via the switch SW31 and is also outputted to outside the chip via the switch SW32.

The constant current Iref can be adjusted to a desired value, for example, by adjusting, based on the result of monitoring the constant current Iref outputted to outside the chip, the current flowing through the MOS transistor Tr34, changing the position of the node N6 on the resistive element R33 or adjusting the current flowing through the MOS transistor Tr35.

Next, how the constant current Iref is generated by the constant-current source 102 and how the constant current Iref can be adjusted will be described. First, a current I2 equal to a current I1 flowing through the MOS transistor Tr31 flows through the MOS transistor Tr32. A current I3 equal to the current I2 flowing through the MOS transistor Tr32 flows through the MOS transistor Tr33.

At this time, a portion of the current I3 denoted as a current I31 flows through the bipolar transistor Tr43. Therefore, the voltage at the node N3 represents the base-emitter voltage Vbe3 of the bipolar transistor Tr43. The remaining portion of the current I3 denoted as a current I32 flows through the resistive elements R32 and R33. A current I4 as large as m times the current I3 flowing through the MOS transistor Tr33 flows through the MOS transistor Tr34.

At this time, the voltage Vbe3 at the node N3 is expressed by equation (1) where: V4 is the voltage at the node N4 (output voltage of a bandgap reference circuit); R331 is the resistance value of a portion of the resistive element R33 with the portion being between the node N6 whose position is selectable on the resistive element R33 and the node N4; and R332 is the resistance value of the resistive element portion between the node N6 and the ground voltage terminal GND.

$$V_{be3} = I_{32} \cdot R_{32} + V_4 \quad (1)$$
$$= I_{32} \cdot R_{32} + (I_{32} + I_4)(R_{331} + R_{332})$$
$$= I_{32}(R_{32} + R_{331} + R_{332}) + I_4(R_{331} + R_{332})$$

From equation (1), the current I32 is expressed by the following equation (2).

$$I_{32} = \frac{V_{be3}}{R_{32} + R_{331} + R_{332}} - \frac{I_4(R_{331} + R_{332})}{R_{32} + R_{331} + R_{332}} \quad (2)$$

The voltage Vref0 at the node N6 is expressed by the following equation (3).

$$V_{ref0} = \quad (3)$$
$$(I_{32} + I_4)R_{332} = \left(\frac{V_{be3}}{R_{32} + R_{331} + R_{332}} - \frac{I_4(R_{331} + R_{332})}{R_{32} + R_{331} + R_{332}} + I_4\right)R_{332} =$$
$$\frac{R_{332}}{R_{32} + R_{331} + R_{332}}(V_{be3} + I_4 \cdot R_{32}) =$$
$$\frac{R_{332}}{R_{32} + R_{331} + R_{332}}\left(V_{be3} + \frac{mR_{32}}{R_{31}}\Delta V_{be}\right)$$

Therefore, the constant current Iref is expressed by the following equation (4).

$$I_{ref} = \frac{1}{\alpha}I_{ref0} = \quad (4)$$
$$\frac{1}{\alpha}\frac{V_5}{R_{34}} = \frac{1}{\alpha}\frac{V_{ref0}}{R_{34}} = \frac{R_{332}}{\alpha R_{34}(R_{32} + R_{331} + R_{332})}\left(V_{be3} + \frac{mR_{32}}{R_{31}}\Delta V_{be}\right)$$

Figure 8:
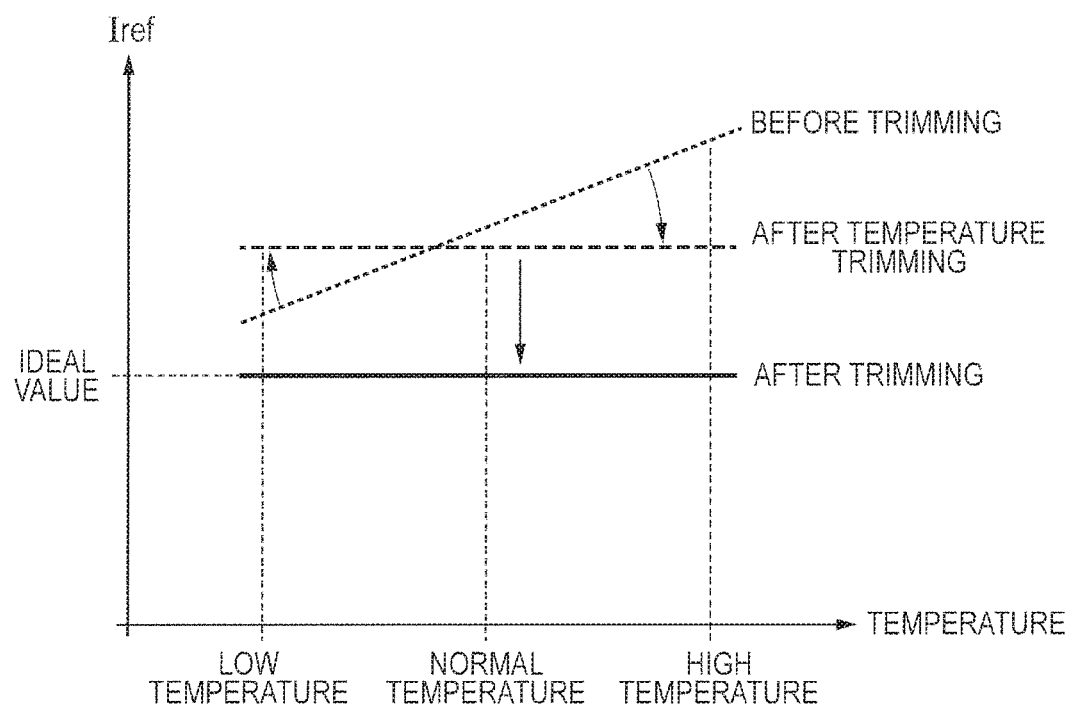
FIG. 8 is a diagram showing output currents of the constant-current source before and after trimming.

In the right-hand side of the equation (4), Vbe3 has a negative temperature characteristic and ΔVbe has a positive temperature characteristic. Therefore, adjusting coefficient m of ΔVbe by switching the on resistance of the MOS transistor Tr33 makes it possible to adjust the temperature characteristic of the constant current Iref. Ideally, the constant current Iref can be kept constant regardless of temperature (see "After temperature trimming" in FIG. 8).

Also, adjusting coefficient α in the right-hand side of the equation (4) by switching the on resistance of the MOS transistor Tr35 makes it possible to adjust the absolute value of the constant current Iref. Furthermore, adjusting the resistance values of resistance components R331 and R332 by changing the position of the node N6 on the resistive element R33 makes it possible to further finely adjust the absolute value of the constant current Iref (see "After trimming" in FIG. 8).

This allows the constant current source 102 to output a constant current Iref regardless of temperature.

The resistive elements R1 and R2 are preferably positioned adjacently to each other. Then, the operating characteristics of the resistive elements R1 and R2 can be approximated to each other (ideally, equalized), so that variations of the resistance values of the resistive elements R1 and R2 can be offset at the AD converter 101. To be specific, a component, corresponding to resistance value variation of the resistive element R1, of the input voltage Vin and a component, corresponding to resistance value variation of the resistive element R2, of the reference voltage Vref can be offset at the AD converter 101.

As described above, in the current detection circuit 100 of the present embodiment, the AD converter 101 AD-converts, using the output current Iref of the constant-current source 102 and the reference voltage Vref generated by the resistive element R2, the input voltage Vin generated by the input current Iin and the resistive element R1. In this way, the current detection circuit 100 of the present embodiment can offset resistance value variations of the resistive elements R1 and R2 at the AD converter 101, so that the accuracy of current detection can be improved.

The present embodiment has been described based on a case in which the current detection unit 12 detects the current flowing through the drive transistor MN1 that is a high-side driver and also the current flowing through the drive transistor MN2 that is a low-side driver, but an alternative configuration may be used. For example, the current detection unit 12 may be configured to detect only the current flowing through either one of the drive transistors MN1 and MN2.

(Modification Example of Current Detection Unit 12)

Figure 9:
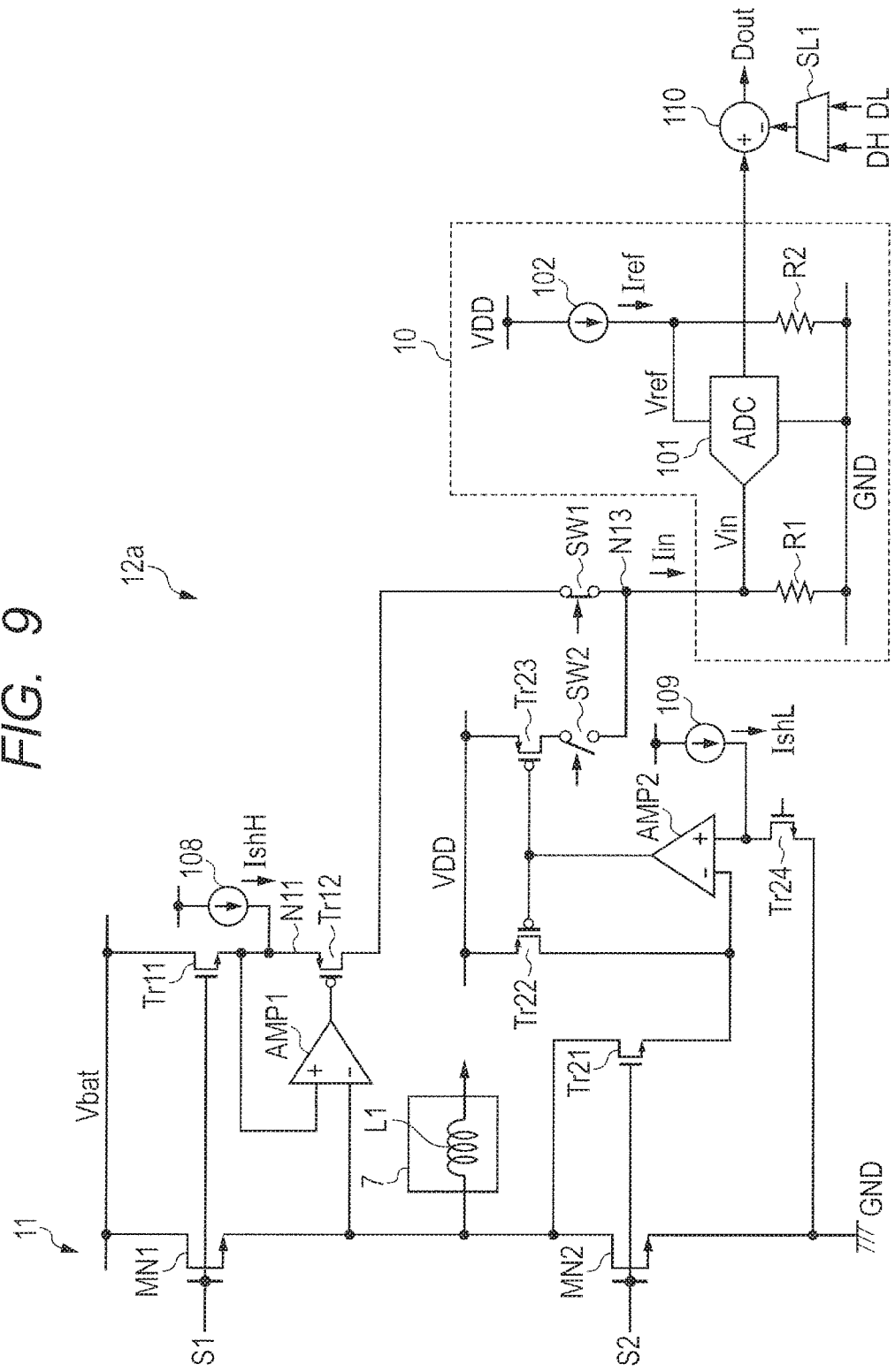
FIG. 9 is a circuit diagram showing a modification example of the current detection unit shown in FIG. 2.

FIG. 9 shows a modification example of the current detection unit 12 that detects the current flowing through the solenoid driver 11 as a current detection unit 12a. As shown in FIG. 9, the current detection unit 12a compared with the current detection unit 12 further includes constant-current sources 108 and 109, a transistor Tr24, a selector SL1, and a subtractor 110. The following description of the present embodiment is based on a case in which the transistor Tr24 is an N-channel MOS transistor.

The constant-current source 108 is positioned between the supply voltage terminal VDD and the node N11 between the source of the transistor Tr11 and the non-inverting input terminal of the operational amplifier AMP1 and outputs a constant current IshH. The transistor Tr24 is positioned between the non-inverting input terminal of the operational amplifier AMP2 and the ground voltage terminal GND and plays a role of a resistive element. The constant-current source 109 is positioned between the supply voltage terminal VDD and the non-inverting input terminal of the operational amplifier AMP2 to be also between the supply voltage terminal VDD and the drain of the transistor Tr24 and outputs a constant current IshL. The selector SL1 selectively outputs one of constants DH and DL depending on the target of current detection. The subtractor 110 is provided on an output path for the digital signal Dout and outputs the digital signal Dout less the constant selected by the selector SL1.

(Concrete Configuration Example of Constant Current Sources 108 and 109)

Figure 10:
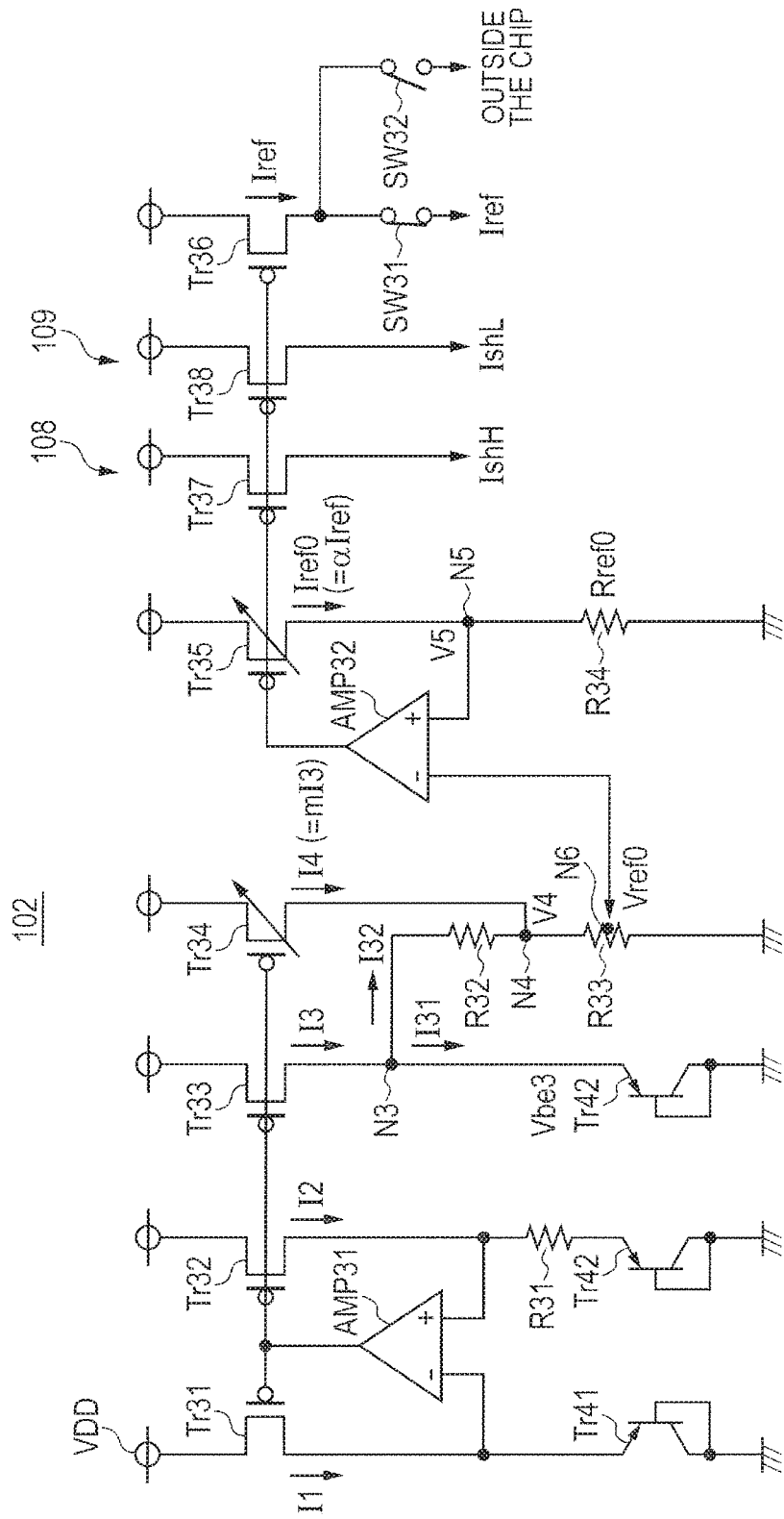
FIG. 10 is a circuit diagram showing a concrete configuration example of constant-current sources included in the current detection unit shown in FIG. 9.

FIG. 10 is a circuit diagram showing a concrete configuration example of the constant-current sources 108 and 109. As shown in FIG. 10, the constant-current sources 108 and 109 are realized by adding transistors Tr37 and Tr38 to the constant-current source 102. The following description of the present embodiment is based on a case in which the transistors Tr37 and Tr38 are both P-channel MOS transistors.

The transistors Tr37 and Tr38 are provided in parallel with the transistor Tr36 and the gate of each of the transistors Tr37 and Tr38 is applied with the output voltage of the operational amplifier AMP32. In this configuration, a constant current IshH flows through the transistor Tr37 and a constant current IshL flows through the transistor Tr38.

The other parts of the current detection unit 12a are the same as the corresponding parts of the current detection unit 12, so that they will not be described below.

Figure 11:
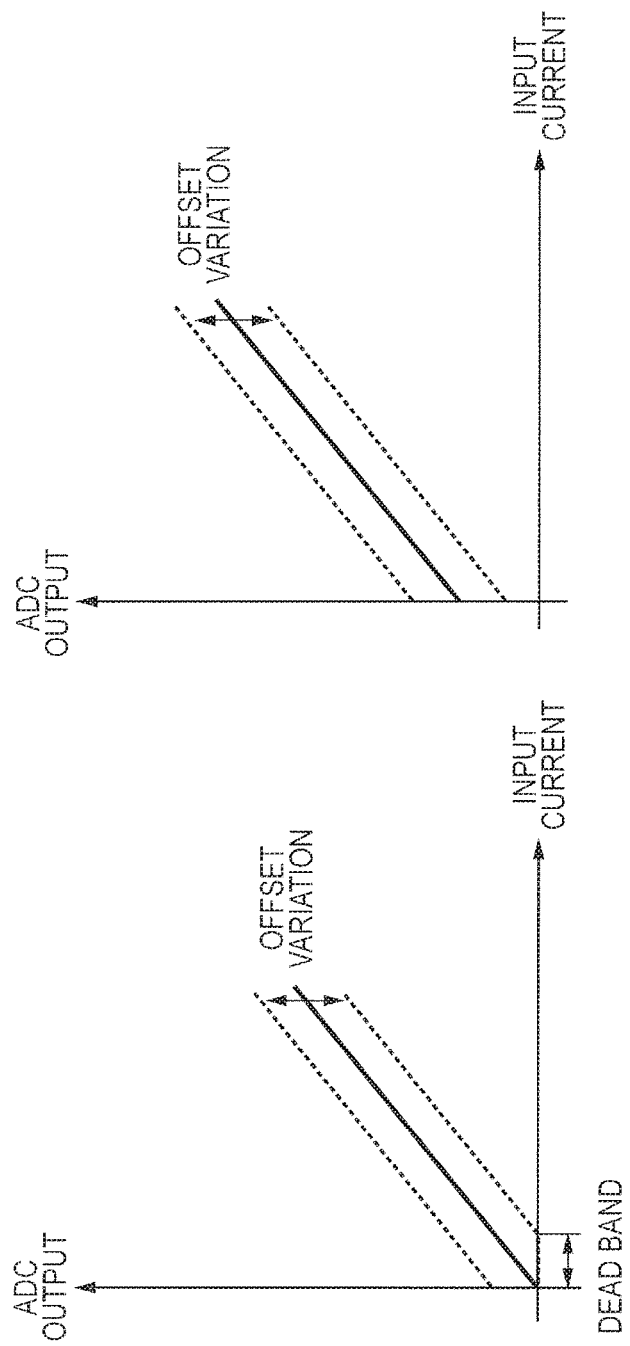
FIG. 11 is a diagram describing improvement concerning a dead-band region.

When the constant current IshH is supplied from the constant-current source 108 to the node N11, the current Iin, that is, the sum of the current flowing through the transistor Tr11 and the constant current IshH serving as an intentional offset current flows through the current detection circuit 100. This allows the AD converter 101 to carry out AD conversion without generating any dead-band region even when the input current Iin includes offset variation (see FIG. 11).

In a case where the current flowing through the drive transistor MN1 is detected, the constant DH is selected by the selector SL1. The subtractor 110 outputs the digital signal Dout less the constant DH. As a result, from the digital signal Dout outputted from the AD converter 101, a portion corresponding to the variation caused by the constant current IshH is removed.

Similarly, when the constant current IshL is supplied from the constant-current source 109 to the non-inverting input terminal of the operational amplifier AMP2, the current Iin, that is, the sum of the current flowing through the transistor Tr21 and the constant current IshL that is an intentional offset current flows through the current detection circuit 100. This allows the AD converter 101 to carry out AD conversion without generating any dead-band region even when the input current Iin includes offset variation (see FIG. 11).

In a case where the current flowing through the drive transistor MN2 is detected, the constant DL is selected by the selector SL1. The subtractor 110 outputs the digital signal Dout less the constant DL. This removes, from the digital signal Dout outputted from the AD converter 101, a portion corresponding to the variation caused by the constant current IshL.

Next, modification examples of the current detection circuit 100 will be described.

(First Modification Example of Current Detection Circuit 100)

Figure 12:
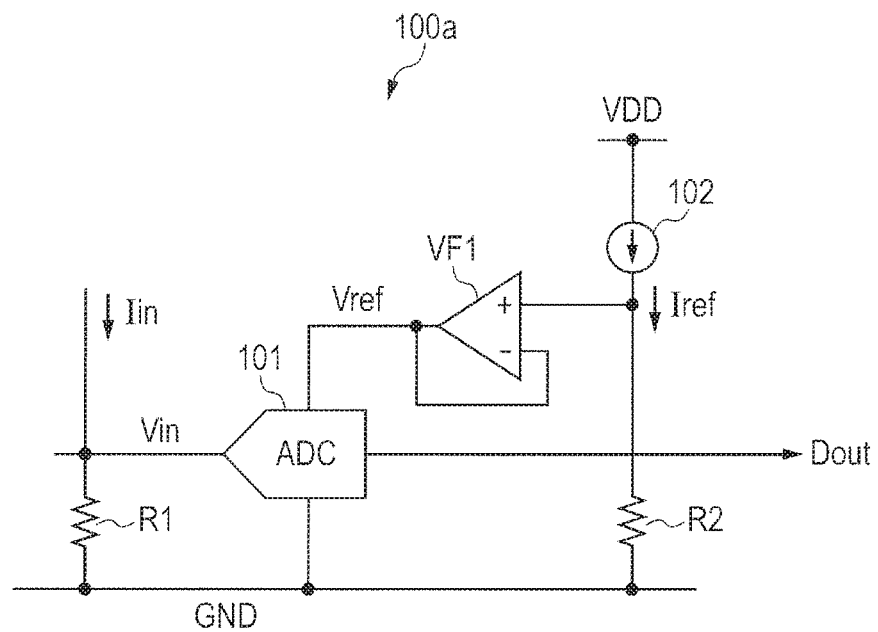
FIG. 12 is a circuit diagram showing a first modification example of the current detection circuit of the first embodiment.

FIG. 12 is a circuit diagram showing a first modification example of the current detection circuit 100. As shown in FIG. 12, the current detection circuit 100a compared with the current detection circuit 100 further includes a voltage follower VF1 which outputs the reference voltage Vref at the same potential. The other parts of the current detection circuit 100a are the same as the corresponding parts of the current detection circuit 100, so that they will not be described below.

The current detection circuit 100a including the voltage follower VF1 between the generation source of the reference voltage Vref and the AD converter 101 can reduce the stabilization error of the reference voltage Vref.

(Second Modification Example of Current Detection Circuit 100)

Figure 13:
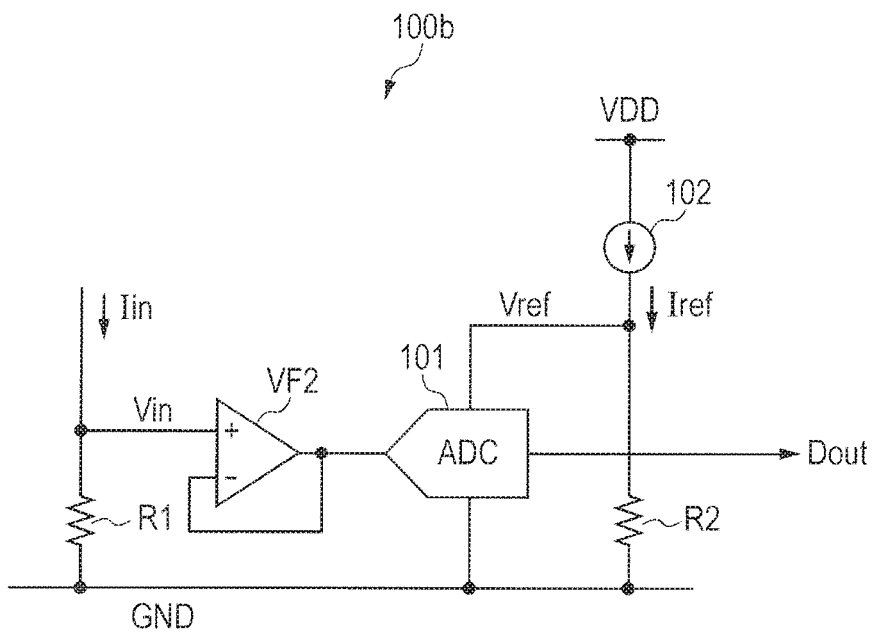
FIG. 13 is a circuit diagram showing a second modification example of the current detection circuit of the first embodiment.

FIG. 13 is a circuit diagram showing a second modification example of the current detection circuit 100 as a current detection circuit 100b. As shown in FIG. 13, the current detection circuit 100b compared with the current detection circuit 100 further includes a voltage follower VF2 which outputs the input voltage Vin at the same potential. The other parts of the current detection circuit 100b are the same as the corresponding parts of the current detection circuit 100, so that they will not be described below.

The current detection circuit 100b including the voltage follower VF2 between the generation source of the input voltage Vin and the AD converter 101 can reduce the stabilization error of the input voltage Vin.

The current detection circuit 100b may further include the voltage follower VF1 between the generation source of the reference voltage Vref and the AD converter 101.

Second Embodiment

Figure 14:
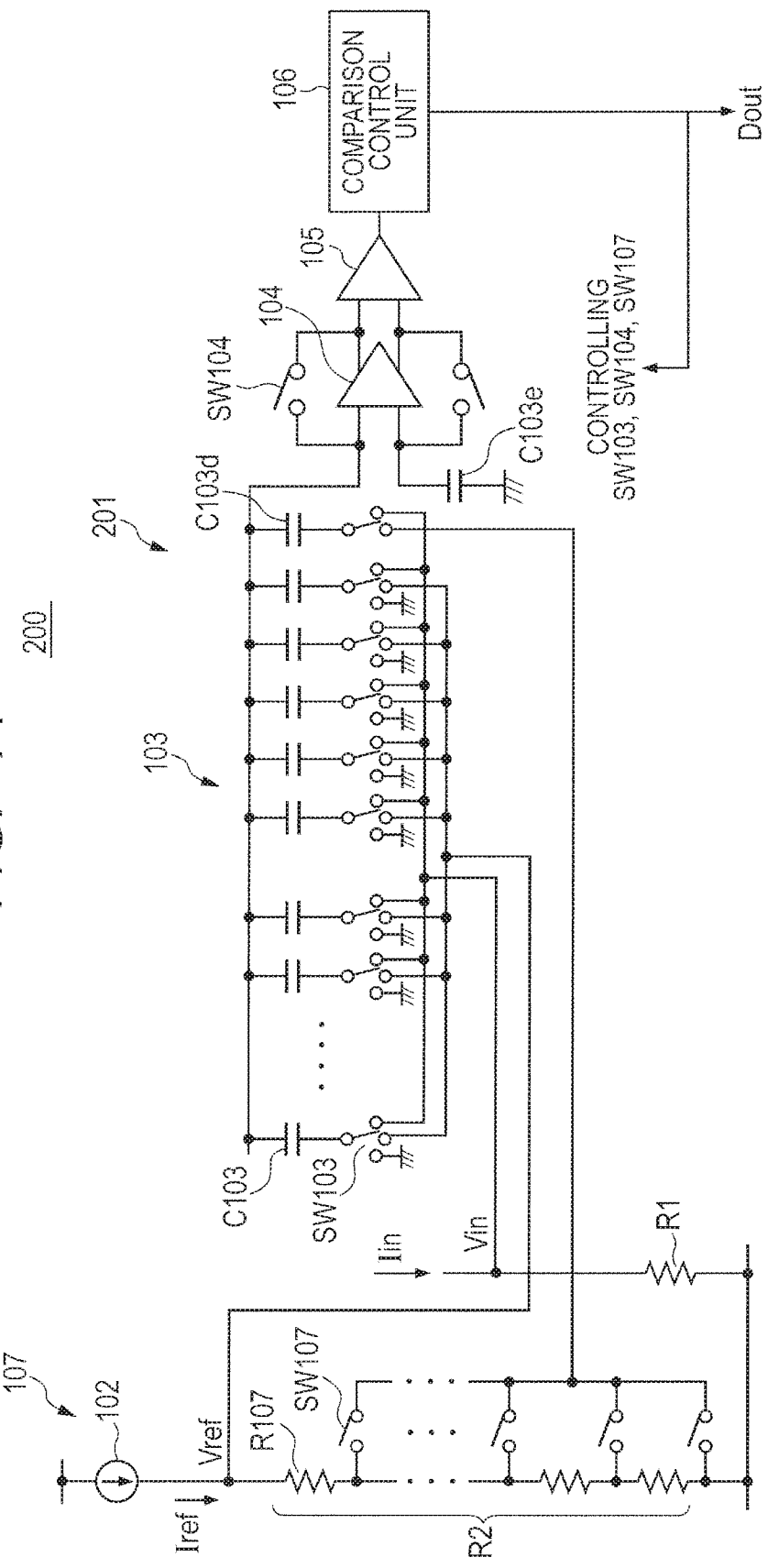
FIG. 14 is a circuit diagram showing a concrete configuration example of a current detection circuit according to a second embodiment of the present invention.

FIG. 14 is a circuit diagram showing a configuration example of a current detection circuit 200 according to a second embodiment of the present invention. As shown in FIG. 14, the current detection circuit 200 compared with the current detection circuit 100 includes an AD converter 201 instead of the AD converter 101. The AD converter 201 compared with the AD converter 101 further includes not only a capacitor-array DA conversion unit 103 but also a resistor-string DA conversion unit 107.

In the AD converter 201, of the plural bits of the digital signal, the value of high-order bits is DA-converted by the capacitor-array DA conversion unit 103 and the value of the remaining low-order bits is DA-converted by the resistor-string DA conversion unit 107. The resistive element R2 is used not only for generating the reference voltage Vref but also as one of the elements configuring the DA conversion unit 107.

To be specific, the DA conversion unit 107 includes plural resistive elements (ladder resistors) R107 forming the resistive element R2 and plural switches SW107 provided between the nodes located between the plural resistive elements R107 and the electrode on one side of a dummy capacitor C103d of the DA conversion unit 103. The turning on/off of the plural switches SW107 is controlled by the comparison control unit 106 based on the mode of operation and the digital signal value to be DA-converted. The plural switches SW107 configure a switch unit.

For example, in the hold mode of the capacitor-array DA conversion unit 103, out of the plural switches SW107 included in the resistor-string DA conversion unit 107, only the one coupled to the ground voltage terminal GND turns on. This causes, as in the case of the AD converter 101, the ground voltage GND to be applied to the electrode on one side of the dummy capacitor C103d of the DA conversion unit 103. Subsequently, when, in charge redistribution mode, the DA conversion unit 103 completes DA conversion of the high-order bits, the DA conversion unit 107 DA-converts the low-order bits.

To be specific, based on the value of the low-order bits of the digital signal outputted from the comparison control unit 106, one of the plural switches SW107 turns on. As a result, an analog voltage corresponding to the value of the low-order bits of the digital signal is applied to the electrode on one side of the dummy capacitor C103d. At this time, the comparator 105 compares the composite analog voltage of an analog voltage outputted from the DA conversion unit 103 and an analog voltage outputted from the DA conversion unit 107 and the input voltage Vin. Based on the result of the comparison made by the comparator 105, the comparison control unit 106 changes the switch SW107 to be tuned on out of the plural switches SW107. The operation like this is repeated to determine the value of the digital signal Dout.

As described above, the current detection circuit 200 of the present embodiment can render effects equivalent to those of the current detection circuit 100. Also, in the current detection circuit 200 of the present embodiment, the resistive element R2 is used not only for generating the reference voltage Vref but also as a ladder resistor of the DA conversion unit 107 included in the AD converter 201. This suppresses the increase of current consumption and circuit scale enlargement.

Next, modification examples of the current detection circuit 200 will be described.

(First Modification Example of Current Detection Circuit 200)

Figure 15:
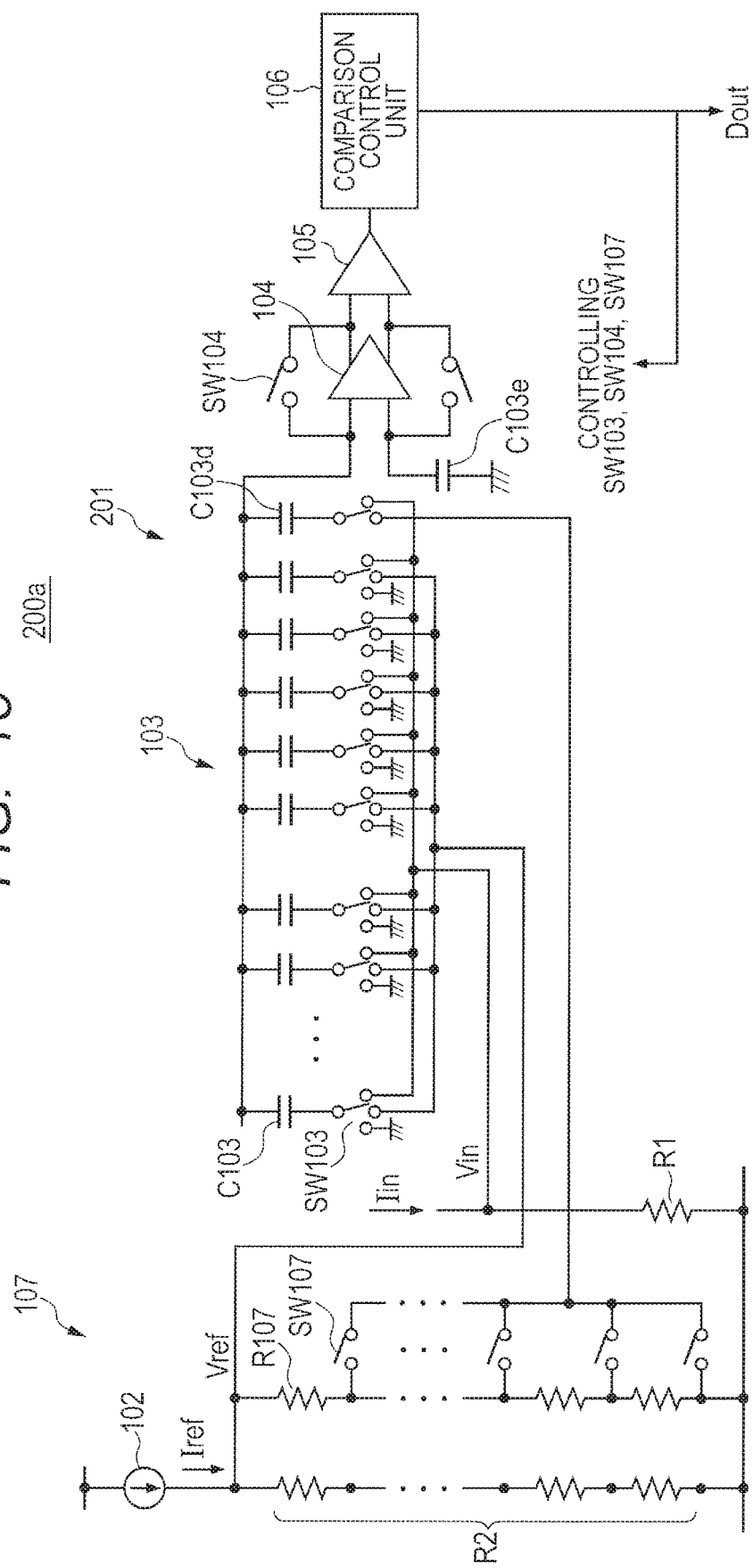
FIG. 15 is a circuit diagram showing a first modification example of the current detection circuit shown in FIG. 14.

FIG. 15 is a circuit diagram showing a first modification example of the current detection circuit 200 as a current detection circuit 200a. As shown in FIG. 15, in the current detection circuit 200a compared with the current detection circuit 200, the whole resistive element R2 is used to generate the reference voltage Vref and a part of the resistive element R2 is used both to generate the reference voltage Vref and also as ladder resistors of the DA conversion unit 107.

To be specific, the DA conversion unit 107 includes plural resistive elements R107 forming a part of the resistive element R2 and plural switches SW107 provided between the nodes located between the plural resistive elements R107 and the electrode on one side of a dummy capacitor C103d of the DA conversion unit 103. The remaining part of the resistive element 2 is provided in parallel with the plural resistive elements R107.

The other parts and operations of the current detection circuit 200a are the same as the corresponding parts and operations of the current detection circuit 200, so that they will not be described below.

The current detection circuit 200a can render effects equivalent to those of the current detection circuit 200.

(Second Modification Example of Current Detection Circuit 200)

Figure 16:
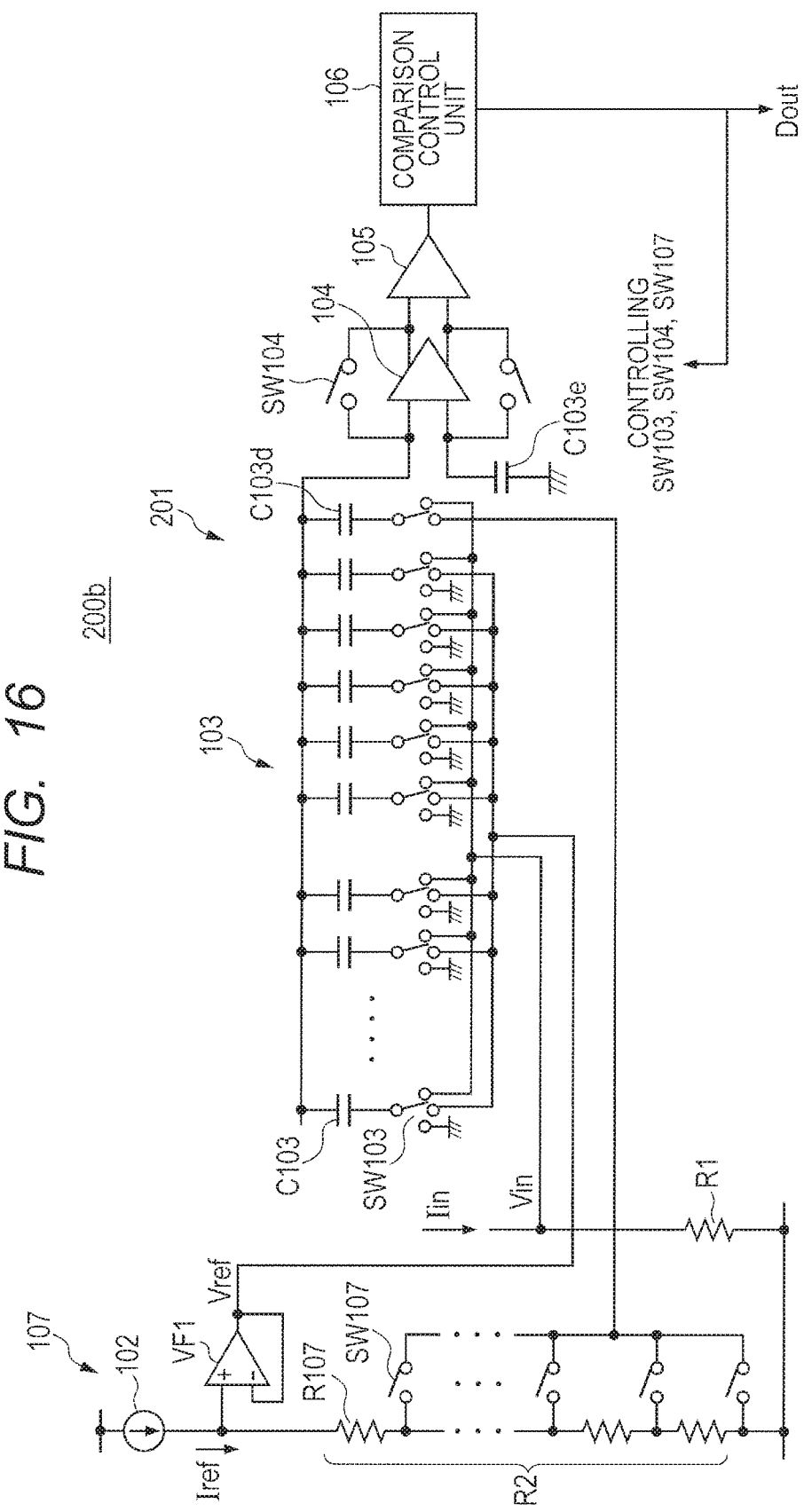
FIG. 16 is a circuit diagram showing a second modification example of the current detection circuit shown in FIG. 14.

FIG. 16 is a circuit diagram showing a second modification example of the current detection circuit 200 as a current detection circuit 200b. As shown in FIG. 16, the current detection circuit 200b compared with the current detection circuit 200 further includes a voltage follower VF1 which outputs the reference voltage Vref at the same potential. The other parts of the current detection circuit 200b are the same as the corresponding parts of the current detection circuit 200, so that they will not be described below.

The current detection circuit 200b including the voltage follower VF1 between the generation source of the reference voltage Vref and the AD converter 201 can reduce the stabilization error of the reference voltage Vref.

(Third Modification Example of Current Detection Circuit 200)

Figure 17:
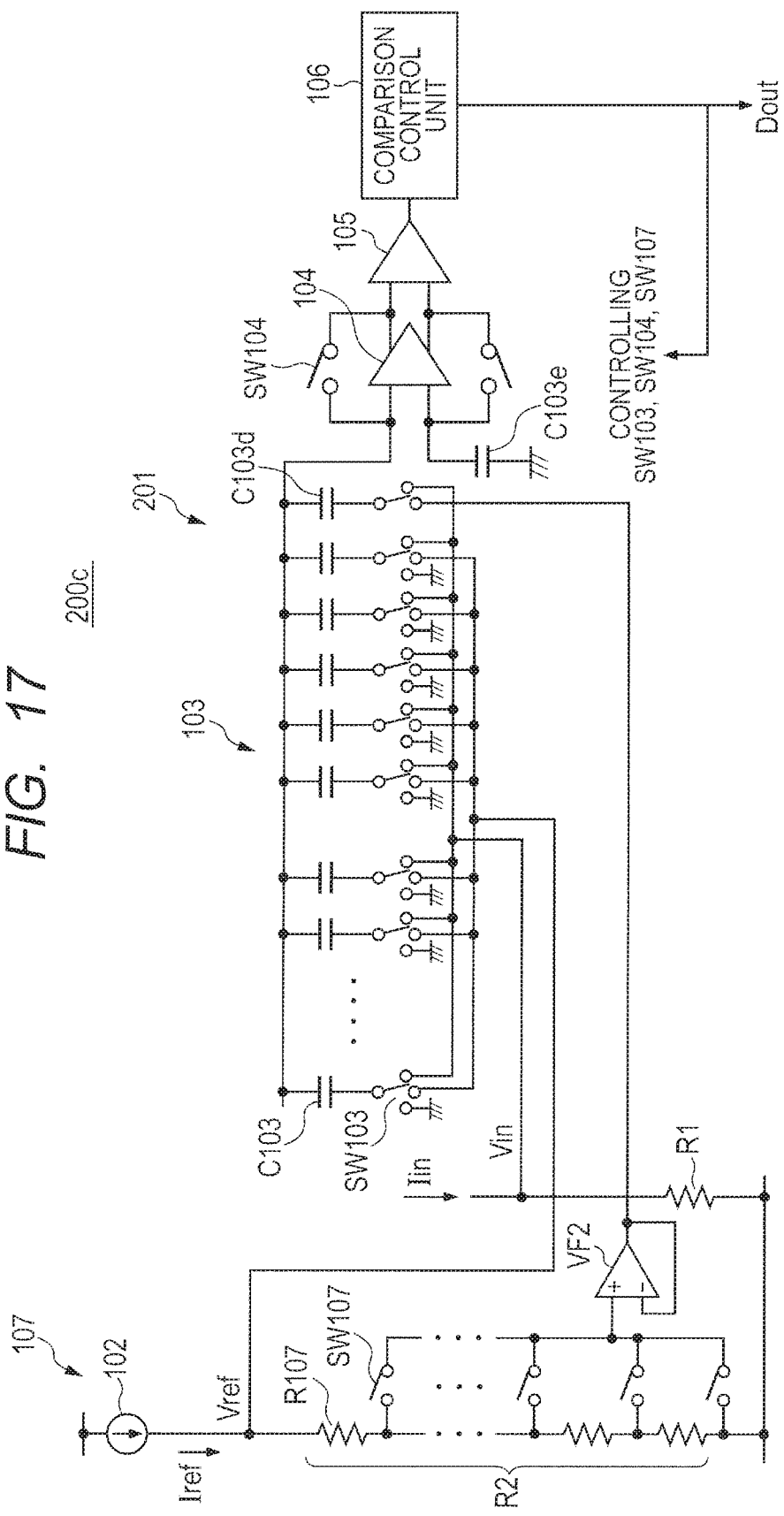
FIG. 17 is a circuit diagram showing a third modification example of the current detection circuit shown in FIG. 14.

FIG. 17 is a circuit diagram showing a third modification example of the current detection circuit 200 as a current detection circuit 200c. As shown in FIG. 17, the current detection circuit 200c compared with the current detection circuit 200 further includes a voltage follower VF2 which outputs the input voltage Vin at the same potential. The other parts of the current detection circuit 200c are the same as the corresponding parts of the current detection circuit 200, so that they will not be described below.

The current detection circuit 200c including the voltage follower VF2 between the generation source of the input voltage Vin and the AD converter 201 can reduce the stabilization error of the input voltage Vin.

The current detection circuit 200c may further include the voltage follower VF1 between the generation source of the reference voltage Vref and the AD converter 101.

(Fourth Modification Example of Current Detection Circuit 200)

Figure 18:
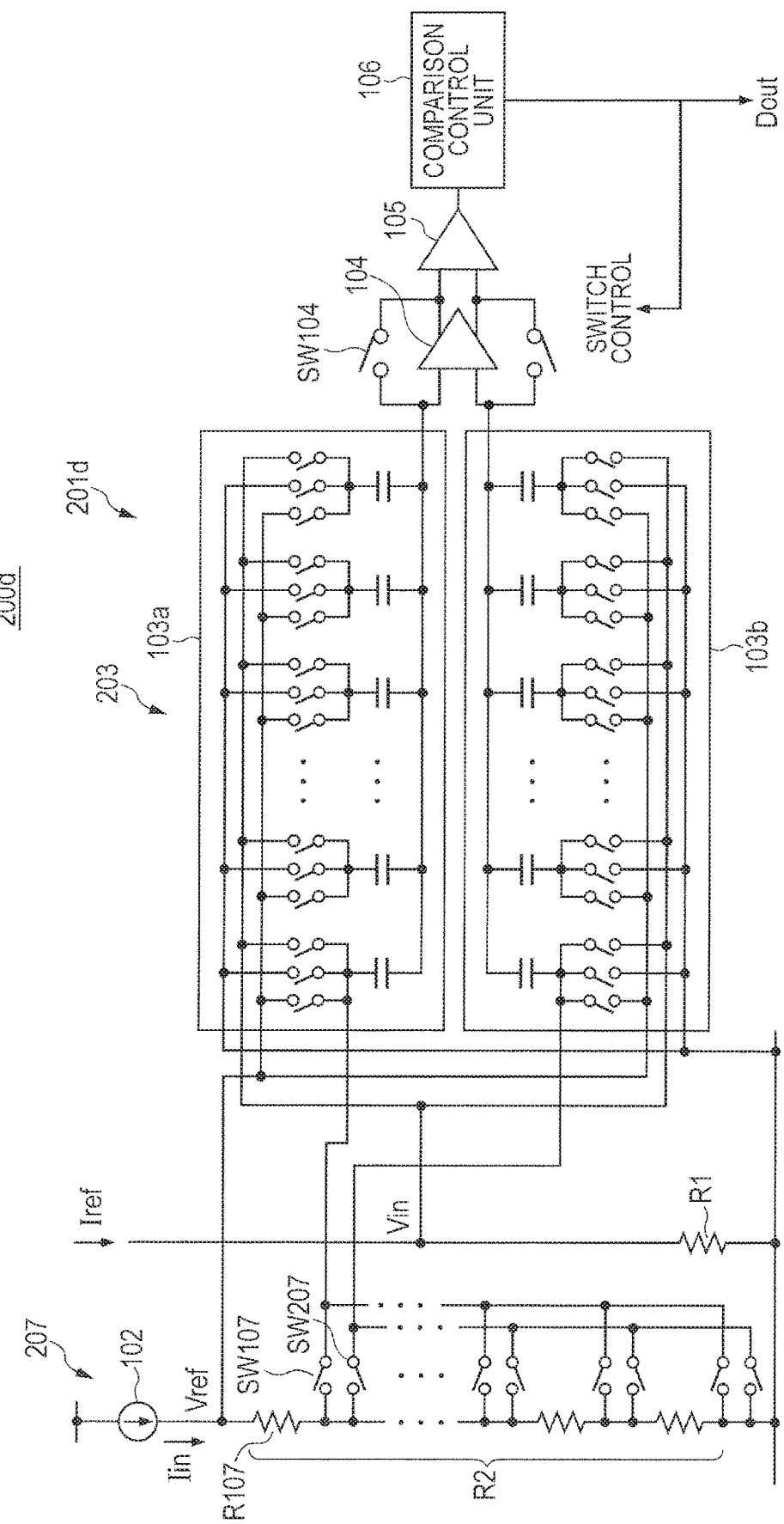
FIG. 18 is a circuit diagram showing a fourth modification example of the current detection circuit shown in FIG. 14.

FIG. 18 is a circuit diagram showing a fourth modification example of the current detection circuit 200 as a current detection circuit 200d. The AD converter included in the current detection circuit 200d has a chopping function.

As shown in FIG. 18, the current detection circuit 200d includes, instead of the AD converter 201, an AD converter 201d. The AD converter 201d includes a DA conversion unit 203 instead of the capacitor-array DA conversion unit 103 and a DA conversion unit 207 instead of the resistor-string DA conversion unit 107.

The DA conversion unit 203 has a configuration which includes two capacitor-array DA conversion units 103. One of the two DA conversion units 103 (hereinafter referred to as the "DA conversion unit 103a") is provided on one input-terminal side of the comparator 105. The other of the two DA conversion units 103 (hereinafter referred to as the "DA conversion unit 103b") is provided on the other input-terminal side of the comparator 105.

The DA conversion unit 207 includes plural resistive elements R107 forming the resistive element R2, plural switches SW107 provided between the nodes located between the plural resistive elements R107 and the electrode on one side of a dummy capacitor of the DA conversion unit 103a, and plural switches SW207 provided between the nodes located between the plural resistive elements R107 and the electrode on one side of a dummy capacitor of the DA conversion unit 103b. The turning on/off of the plural switches SW107 and plural switches SW207 is controlled by the comparison control unit 106 based on the mode of operation and the value of the digital signal to be DA-converted.

Figure 19:
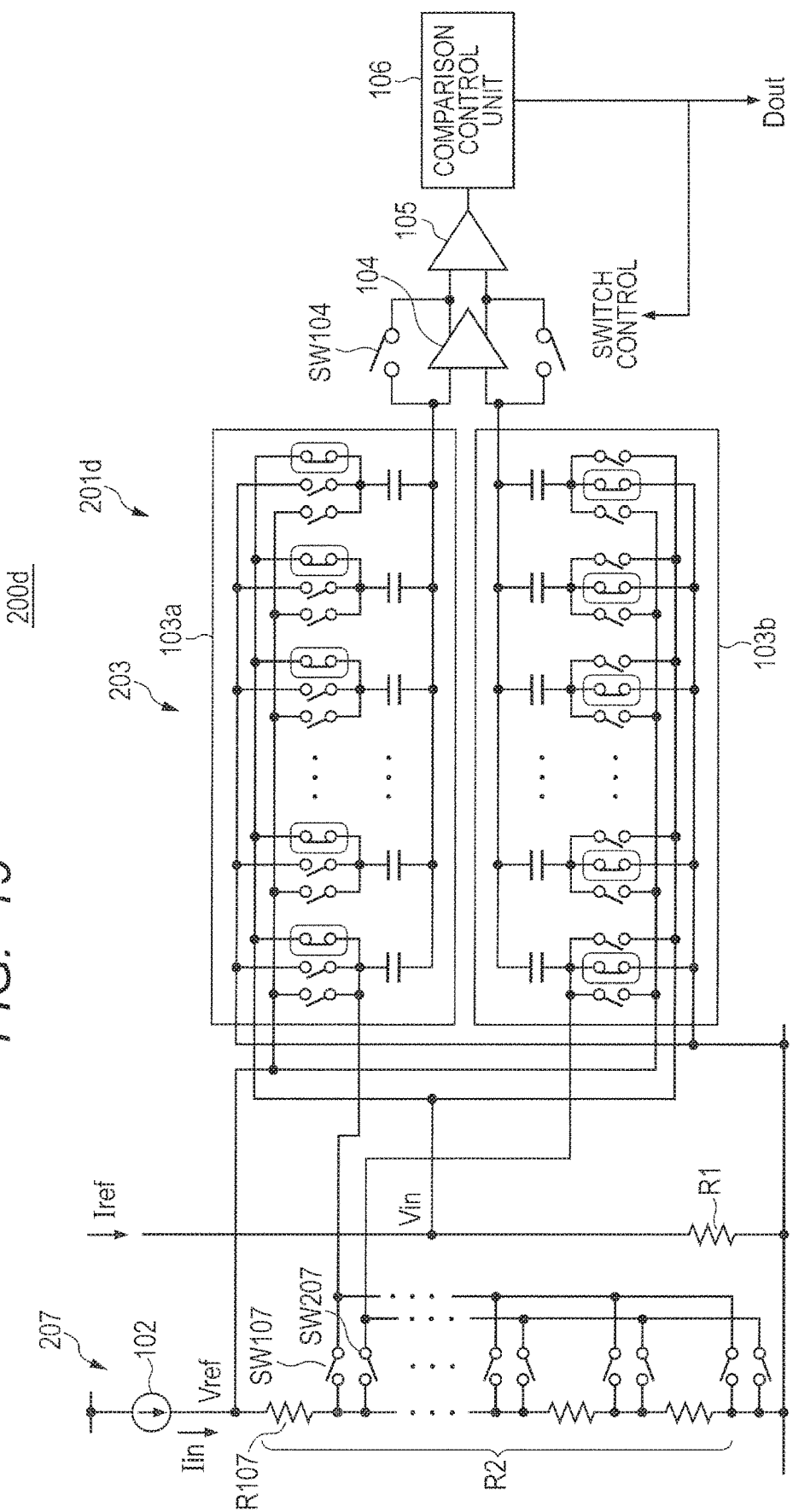
FIG. 19 is a diagram for describing sampling operation by one of two capacitor-array DA conversion units included in the current detection circuit shown in FIG. 18.

For example, in cases where, of the two DA conversion units 103a and 103b included in the DA conversion unit 203, the DA conversion unit 103a carries out DA conversion, the electrodes on one side of the plural capacitors included in the DA conversion unit 103b are each applied with the ground voltage GND (in the example shown in FIG. 19, out of the plural switches included in the DA conversion unit 103b, those switches surrounded by solid line are kept on). When, in the above state, the input voltage Vin is applied to each of the electrodes on one side of the plural capacitors included in the DA conversion unit 103a, the input voltage Vin is sampled (in the example shown in FIG. 19, out of the plural switches included in the DA conversion unit 103a, those switches surrounded by solid line are kept on).

Figure 20:
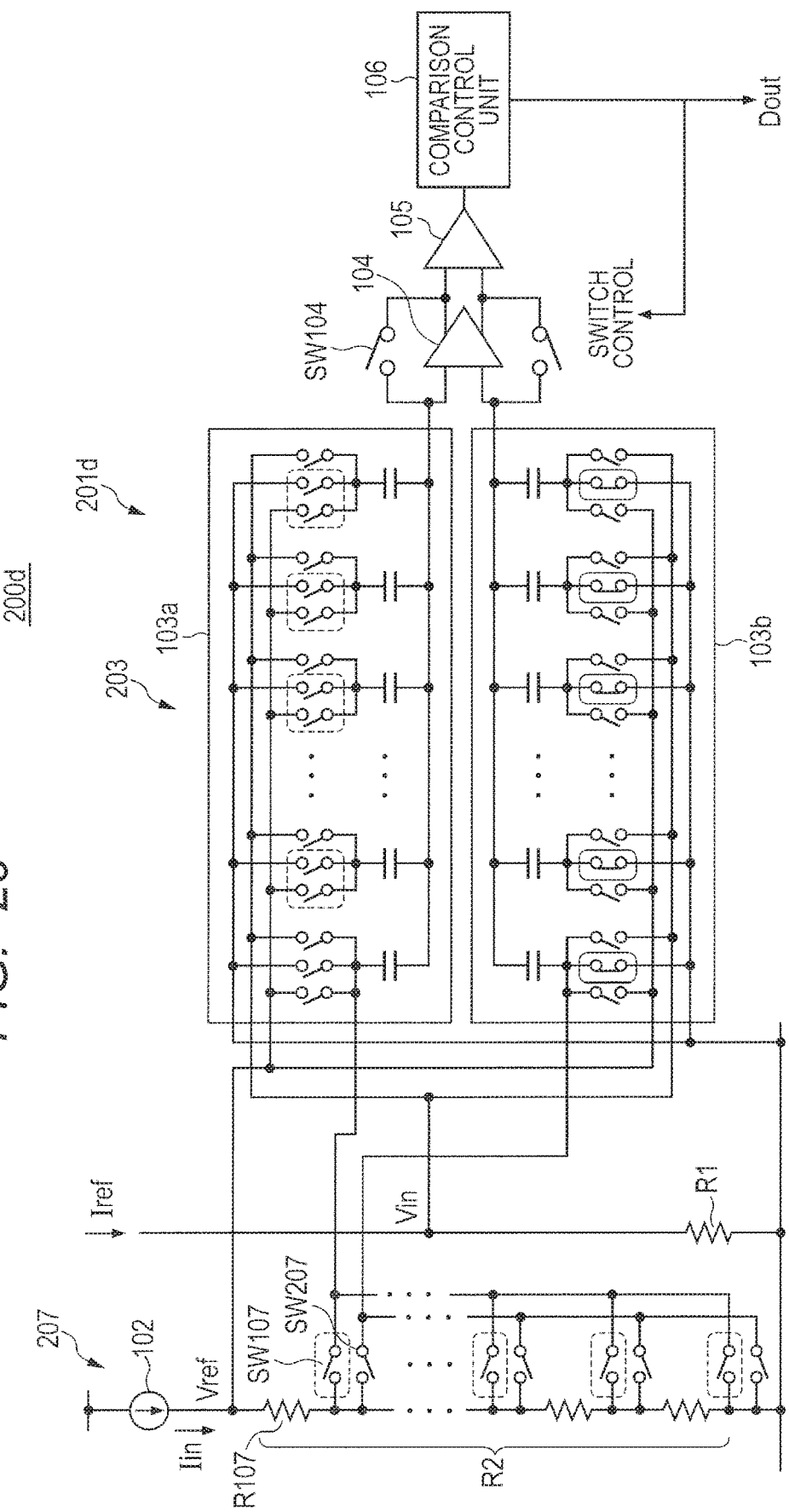
FIG. 20 is a diagram for describing charge redistribution operation by the one of the two capacitor-array DA conversion units included in the current detection circuit shown in FIG. 18.

In the subsequent charge redistribution mode, the DA conversion unit 103a performs switching in a manner similar to that used in the above-described case of the DA conversion unit 103 (in the example shown in FIG. 20, out of the plural switches included in the DA conversion unit 103a and the plural switches SW107 included in the DA conversion unit 207, turning on/off of those switches surrounded by broken line is controlled). This determines the value of the digital signal Dout.

Figure 21:
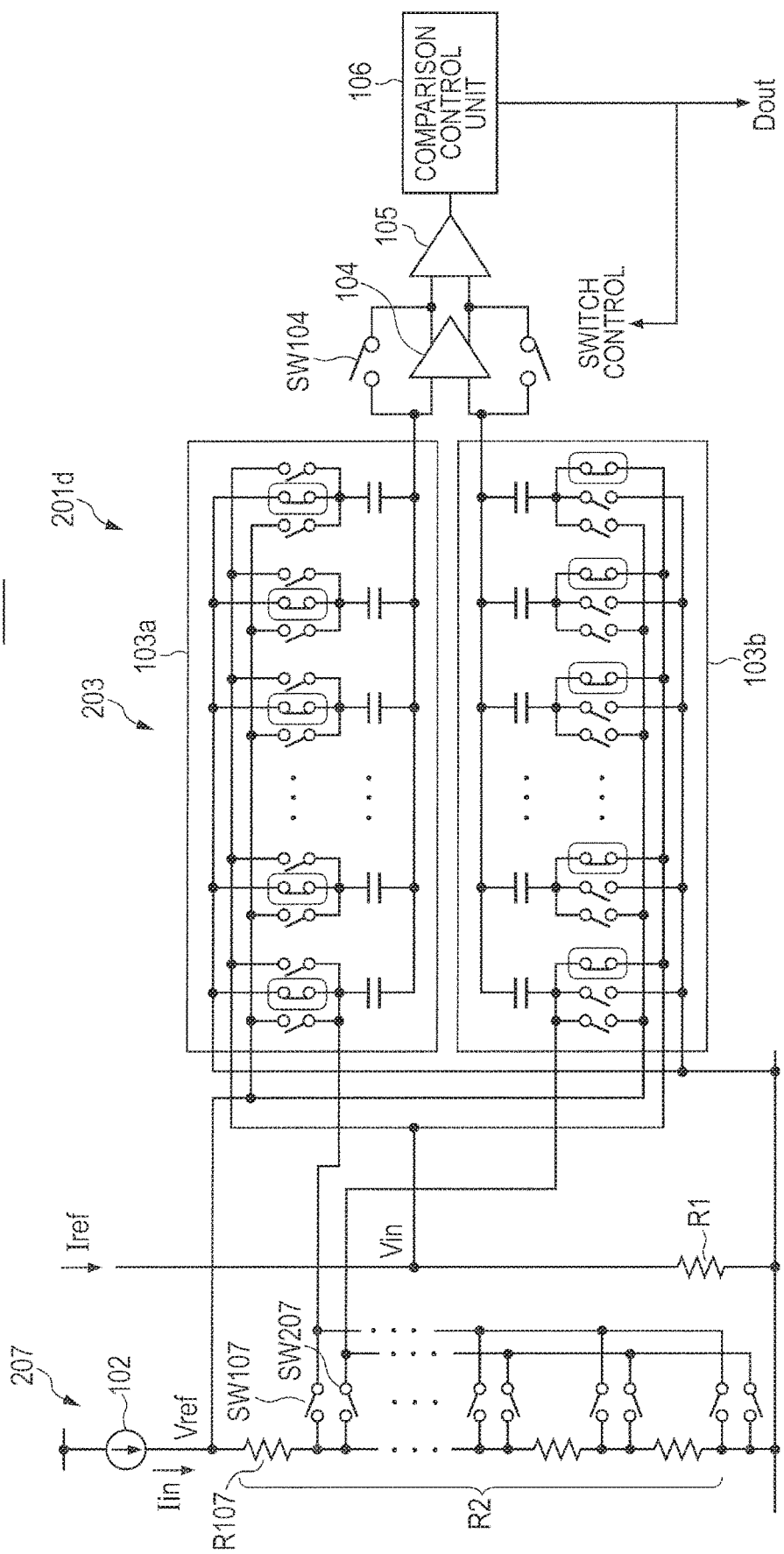
FIG. 21 is a diagram for describing sampling operation by the other of the two capacitor-array DA conversion units included in the current detection circuit shown in FIG. 18.

In cases where, of the two DA conversion units 103a and 103b included in the DA conversion unit 203, the DA conversion unit 103b carries out DA conversion, the electrodes on one side of the plural capacitors included in the DA conversion unit 103a are each applied with the ground voltage GND (in the example shown in FIG. 21, out of the plural switches included in the DA conversion unit 103a, those switches surrounded by solid line are kept on). When, in the above state, the input voltage Vin is applied to each of the electrodes on one side of the plural capacitors included in the DA conversion unit 103b, the input voltage Vin is sampled (in the example shown in FIG. 21, out of the plural switches included in the DA conversion unit 103b, those switches surrounded by solid line are kept on).

Figure 22:
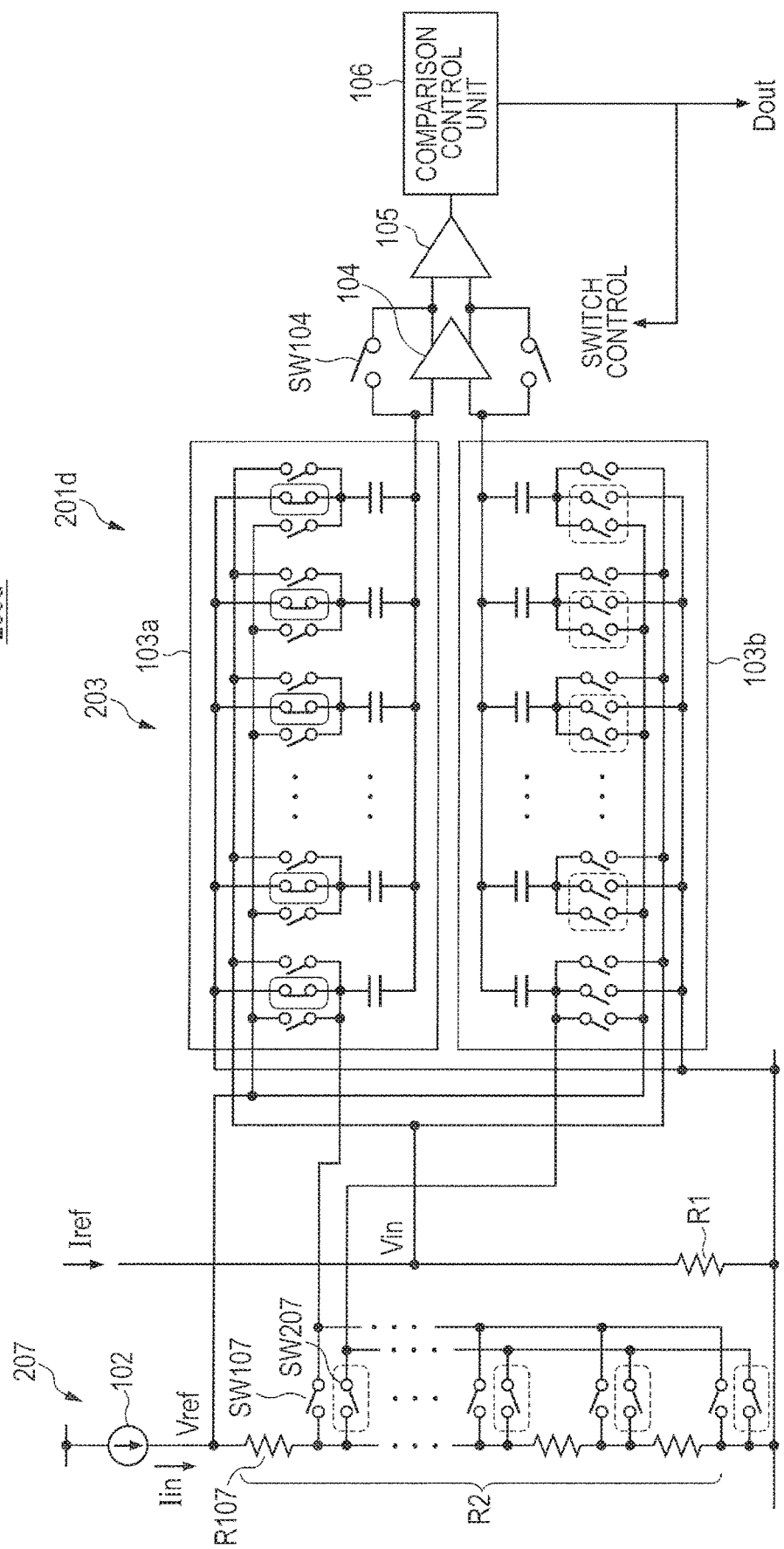
FIG. 22 is a diagram for describing charge redistribution operation by the other of the two capacitor-array DA conversion units included in the current detection circuit shown in FIG. 18.

In the subsequent charge redistribution mode, the DA conversion unit 103b performs switching in a manner similar to that used in the above-described case of the DA conversion unit 103 (in the example shown in FIG. 22, out of the plural switches included in the DA conversion unit 103b and the plural switches SW207 included in the DA conversion unit 207, turning on/off of those switches surrounded by broken line is controlled). This determines the value of the digital signal Dout.

As described above, by using the chopping function, the current detection circuit 200d can suppress offset variation, INL (Integral Non-Linearity error) and DNL (Differential Non-Linearity error).

Third Embodiment

Figure 23:
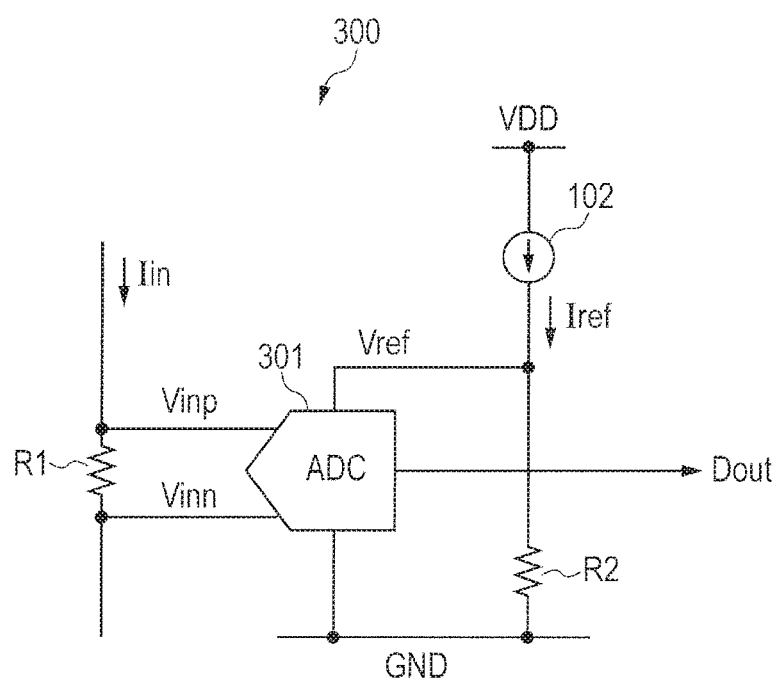
FIG. 23 is a diagram showing a configuration example of a current detection circuit according to a third embodiment of the present invention.

FIG. 23 is a diagram showing a configuration example of a current detection circuit 300 according to a third embodiment of the present invention. As shown in FIG. 23, the current detection circuit 300 generates a pair of differential input voltages Vinp and Vinn out of a current Iin inputted from outside and AD-converts the differential input voltages.

To be specific, the current detection circuit 300 compared with the current detection circuit 100 includes an AD converter 301 instead of the AD converter 101. A current Iin supplied from outside flows through the resistive element R1. This causes the input voltage Vinp to be outputted from one terminal of the resistive element R1 and the input voltage Vinn to be outputted from the other terminal of the resistive element R1.

The AD converter 301 AD-converts the pair of differential input voltages Vinp and Vinn and outputs the digital signal Dout resulting from the AD conversion. In other words, the AD converter 301 AD-converts the voltage difference between the input voltages Vinp and Vinn and outputs the digital signal Dout resulting from the AD conversion.

(Concrete Configuration Example of Current Detection Circuit 300)

Figure 24:
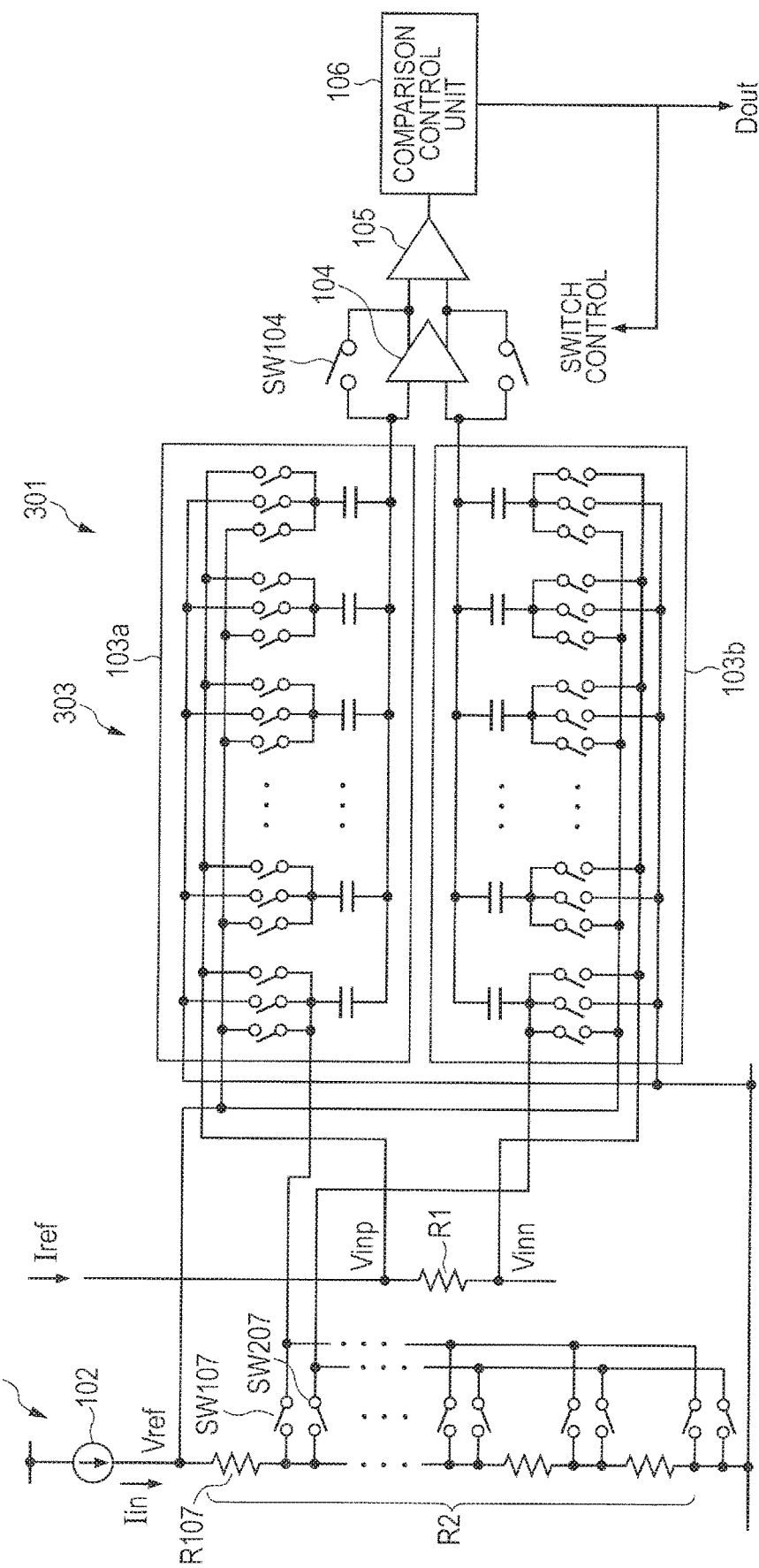
FIG. 24 is a circuit diagram showing a concrete configuration example of the current detection circuit shown in FIG. 23.

FIG. 24 is a circuit diagram showing a concrete configuration example of the current detection circuit 300. As shown in FIG. 24, the current detection circuit 300 includes an AD converter 301 instead of the AD converter 101. The AD converter 301 includes a DA conversion unit 303, the preamplifier 104, the switch SW104, the comparator 105, and the comparison control unit 106.

The DA conversion unit 303 basically has a circuit configuration similar to that of the DA conversion unit 203 included in the current detection circuit 200d shown in FIG. 18. Note, however, that, of the two DA conversion units 103a and 103b included in the DA conversion unit 303, the DA conversion unit 103a is supplied with, instead of the input voltage Vin, the input voltage Vinp that is one of the differential input voltages and the DA conversion unit 103b is supplied with, instead of the input voltage Vin, the input voltage Vinn that is the other one of the differential input voltages.

As described above, the current detection circuit 300 of the present embodiment can render effects equivalent to those of the current detection circuits according to the first and second embodiments.

The present embodiment has been described based on a case in which the current detection circuit 300 generates a pair of differential input voltages Vinp and Vinn from the current Iin inputted from outside, but the current detection circuit 300 is not limited to the above configuration. The configuration of the current detection circuit 300 may be changed such that the pair of differential input voltages Vinp and Vinn are generated from two currents inputted from outside. Such a configuration will be briefly described below.

(Modification Example of Current Detection Circuit 300)

Figure 25:
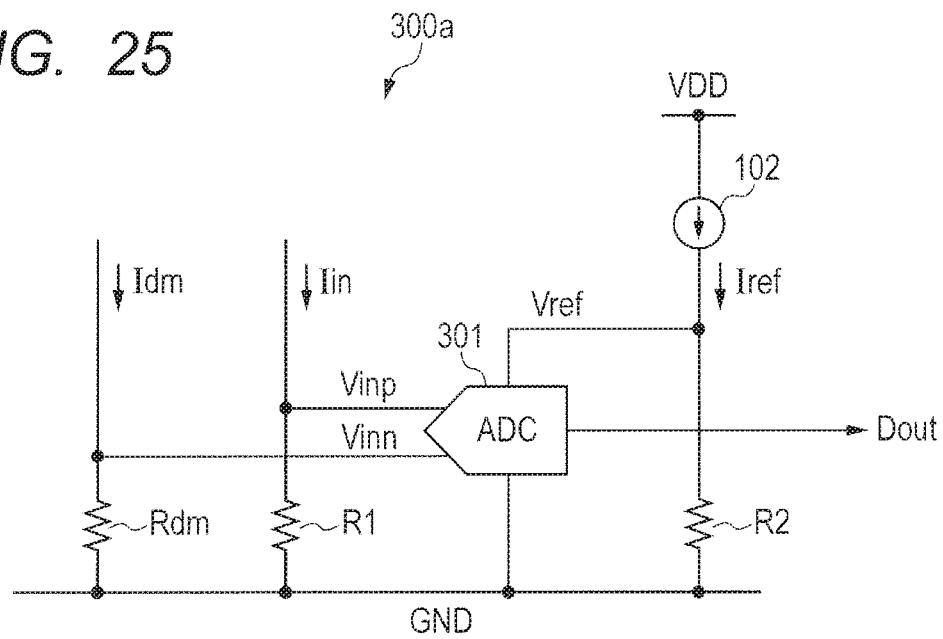
FIG. 25 is a diagram showing a modification example of the current detection circuit shown in FIG. 23.

FIG. 25 is a diagram showing a modification example of the current detection circuit 300 as a current detection circuit 300a. As shown in FIG. 25, the current detection circuit 300a generates a pair of differential input voltages from two currents inputted from outside and AD-converts the differential input voltages.

To be specific, the current detection circuit 300a compared with the current detection circuit 300 further includes a resistive element Rdm. The current Iin supplied from outside flows through the resistive element R1. This causes the input voltage Vinp to be generated at one end of the resistive element R1. A current Idm supplied from outside is supplied to the resistive element Rdm. This causes the input voltage Vinn to be generated at one end of the resistive element Rdm.

The AD converter 301 AD-converts the pair of differential input voltages Vinp and Vinn and outputs the digital signal Dout resulting from the AD conversion. In other words, the AD converter 301 AD-converts the voltage difference between the input voltages Vinp and Vinn and outputs the digital signal Dout resulting from the AD conversion.

The resistive elements R1, R2 and Rdm are preferably adjacently positioned. Then, the operating characteristics of the resistive elements R1, R2 and Rdm can be mutually approximated (ideally, equalized), so that variations of the resistance values of the resistive elements R1, R2 and Rdm can be offset at the AD converter 301.

(Plan View of Resistive Elements R1 and R2)

Figure 26:
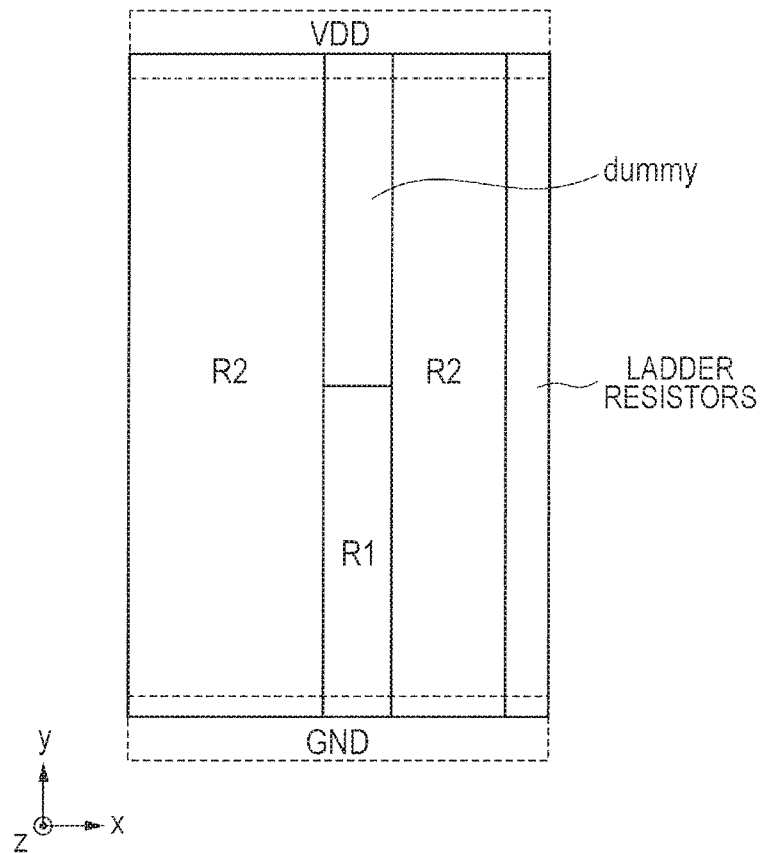
FIG. 26 is a plan view of layout of resistive elements R1 and R2.

FIG. 26 is a plan view of layout of the resistive elements R1 and R2. As shown in FIG. 26, the resistive element R2 is positioned along with a dummy resistive element in a center portion in the x-axis direction of a rectangular layout area. The resistive element R1 is separated into two both extending in the y-axis direction respectively on both sides of the resistive element R2 and the dummy resistive element. One end of the resistive element R1 is coupled, along with one end of the resistive element R2, to the ground voltage GND line and the other end of the resistive element R1 is coupled to the reference voltage Vref line. The other end of the resistive element R1 is to be supplied with the input current Iin.

In cases where, as in the configuration shown in FIG. 15, a portion of the resistive element R2 is used as ladder resistors R107, the ladder resistors R107 are positioned along an outer peripheral portion of the rectangular layout area. This makes it easy to extract voltage from nodes between ladder resistors.

The layout configuration shown in FIG. 26 can be used for any of the current detection circuits 100, 200 and 300 and their modifications.

(Relationship Between Current Dependence of Resistance Values of Resistive Elements R1, R2 and Current Detection Error)

Figure 27:
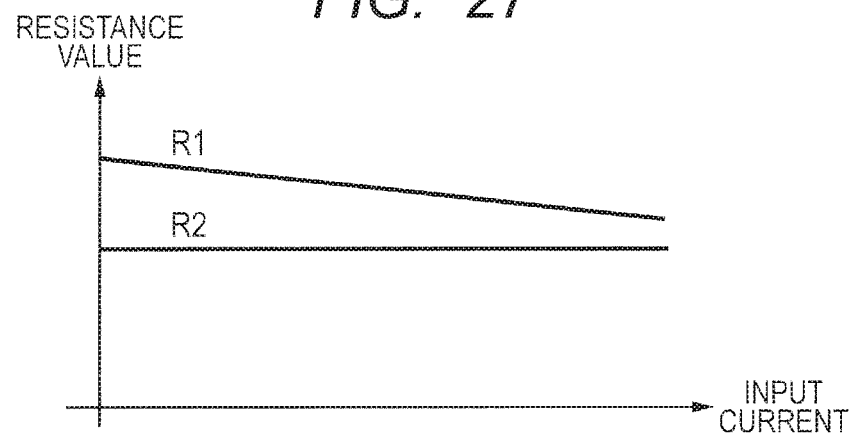
FIG. 27 is a diagram showing relationship between the current dependence of resistance values of the resistive elements R1 and R2 and the current detection error.
Figure 27:
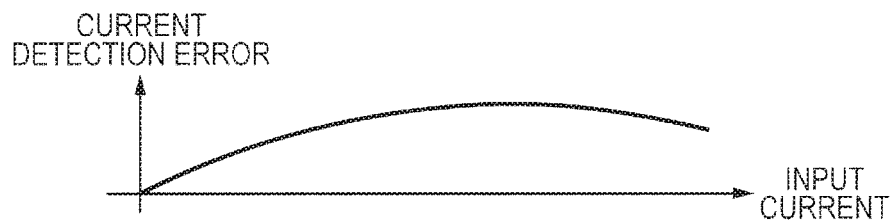

FIG. 27 is a diagram showing relationship between the current dependence of resistance values of the resistive elements R1 and R2 and the current detection error. Generally, the resistance value of a resistive element varies with the value of current flowing through the resistive element. In the example shown in FIG. 27, when the input current Iin flowing through the resistive element R1 is larger, the resistance value of the resistive element R1 is smaller. In the case of the resistive element R2, since the current Iref flowing through the resistive element R2 is constant, the resistance value of the resistive element R2 is constant without being affected by the input current Iin. This generates a current detection error dependent on the input current Iin. In the example shown in FIG. 27, as the input current Iin increases from 0 A, the current detection error becomes larger until reaching a peak, then, after reaching a peak, becomes gradually smaller.

The current dependence of the resistance value of a resistive element is attributable to heat generation by the current flowing through the resistive element. Hence, equalizing the densities of currents flowing through the resistive elements R1 and R2 equalizes the resistance values of the resistive elements R1 and R2 and eliminates the current detection error. To be specific, the current detection error can be suppressed by designing such that Iinx is about 0.83 time Iinfs: where Iinx is the value of the input current Iin when the densities of currents flowing through the resistive elements R1 and R2 are equal; and Iinfs is a maximum value (full-scale value) of the input current Iin. This will be described in detail below.

Figure 28:
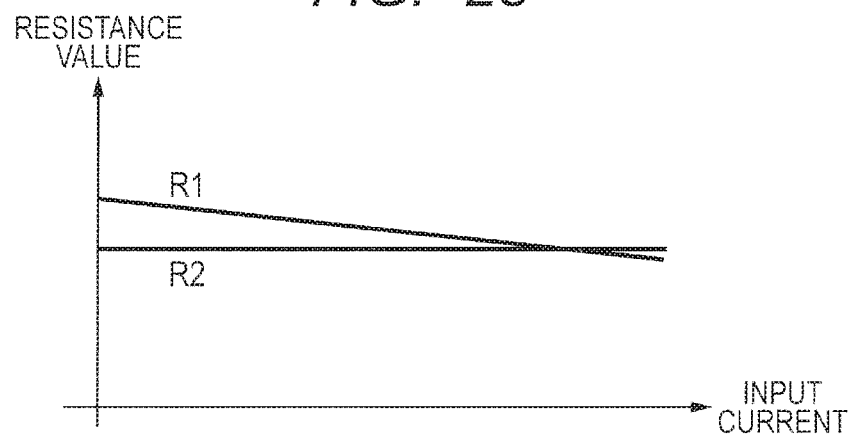
FIG. 28 is a diagram showing relationship after implementation of an improvement measure between the current dependence of resistance values of the resistive elements R1 and R2 and the current detection error.
Figure 28:
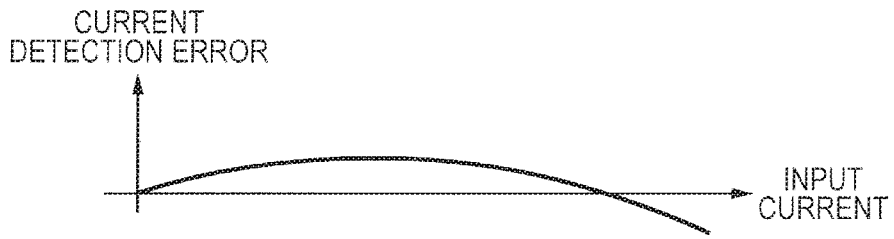
Figure 29:
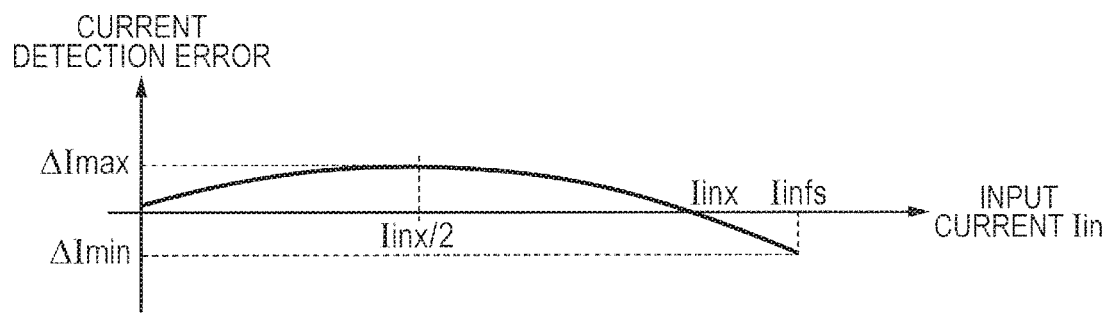
FIG. 29 is a diagram for describing relationship between the current dependence of resistance values of the resistive elements R1 and R2 and the current detection error in more detail.

FIG. 28 is a diagram showing relationship after implementation of an improvement measure between the current dependence of resistance values of the resistive elements R1 and R2 and the current detection error. When current detection error $\Delta I$ can be approximated by a quadratic function of the input current Iin, the relationship between the input current Iin and the current detection error $\Delta I$ can be represented as shown in FIG. 29.

In this case, the current detection error $\Delta I$ can be expressed by the following equation (5) where a is a constant.

$$\Delta I = -a \cdot Iin(Iin - Iinx) \quad (5)$$

The maximum value $\Delta Imax$ and minimum value $\Delta Imin$ of the current detection error $\Delta I$ are expressed by equations (6) and (7).

$$\Delta Imax = -\frac{a \cdot Iinx}{2}\left(\frac{Iinx}{2} - Iinx\right) = \frac{a \cdot Iinx^2}{4} \quad (6)$$

$$\Delta Imin = -a \cdot Iinfs(Iinfs - Iinx) = -a \cdot Iinfs^2 + a \cdot Infs \cdot Iinx \quad (7)$$

When the following equation (8) holds, the absolute value of the current detection error $\Delta I$ becomes a minimum.

$$\Delta Imax = -\Delta Imin \quad (8)$$

From the equations (6), (7) and (8), the following equation (9) is established.

$$\frac{a \cdot Iinx^2}{4} = a \cdot Iinfs^2 - a \cdot Infs \cdot Iinx \quad (9)$$

From the equation (9), the following equation (10) holds.

$$\frac{a \cdot Iinx^2}{4} + a \cdot Iinfs \cdot Iinx - a \cdot Iinfs^2 = 0 \quad (10)$$

From the equation (10), Iinx is expressed as the following equation (11).

$$Iinx = 2(-1 \pm \sqrt{2})Iinfs \quad (11)$$

Since Iinx is a positive value, it can be expressed as the following equation (12).

$$Iinx = 2(\sqrt{2} - 1)Iinfs \quad (12)$$

Thus, the current detection error $\Delta I$ can be suppressed by designing such that Iinx is 0.83 times the maximum value Iinfs of the input current Iin.

As described above, in each of the current detection circuits according to the first to third embodiments, the AD converter AD-converts the input voltage Vin generated by the input current Iin and the resistive element R1 using the output current Iref of the constant-current source and the reference voltage Vref generated by the resistive element R2. This makes it possible for each of the current detection circuits according to the first to third embodiments to offset the resistance value variations of the resistive elements R1 and R2 at the AD converter and to, thereby, improve the current detection accuracy.

The invention made by the present inventors has been concretely described based on embodiments, but the invention is not limited to the foregoing embodiments and can be modified in various ways without departing from the scope of the invention.

Figure 30:
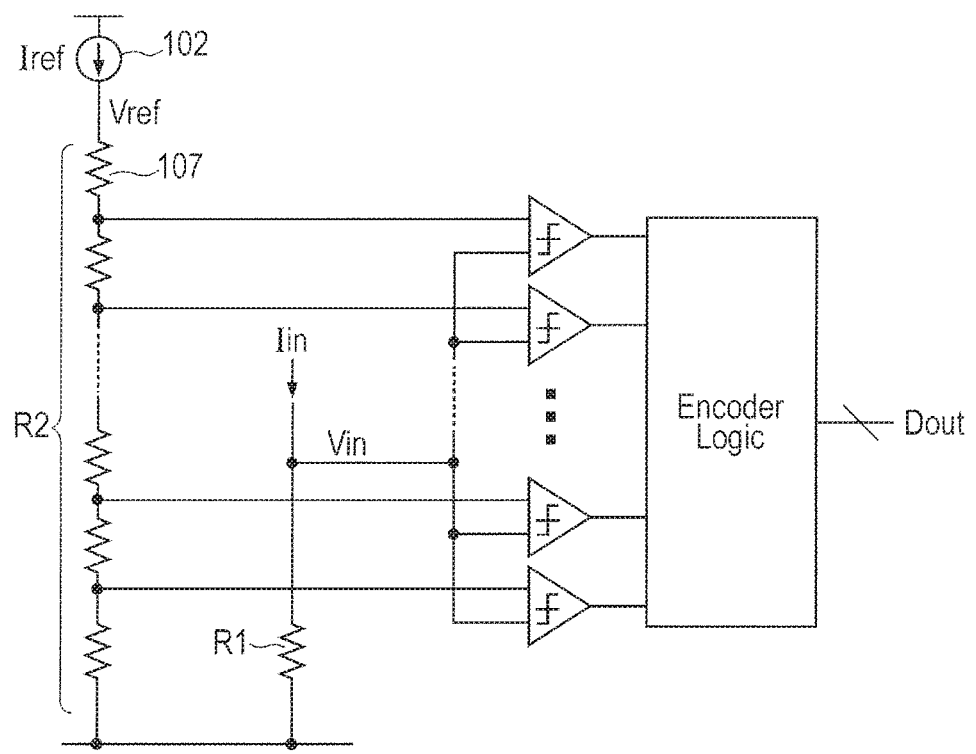
FIG. 30 is a diagram showing another example of AD converter included in a current detection circuit.
Figure 31:
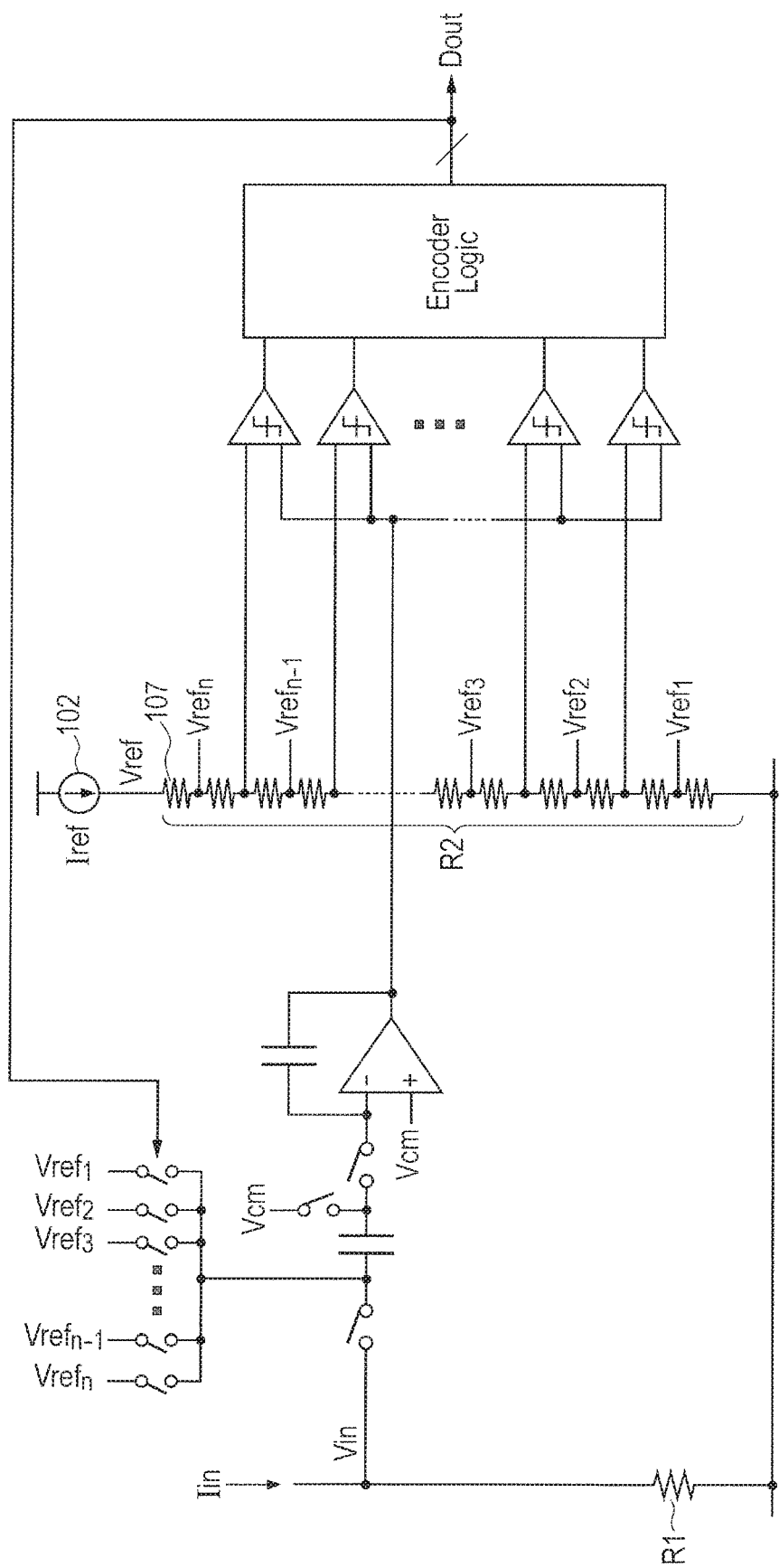
FIG. 31 is a diagram showing still another example of AD converter included in a current detection circuit.

The first to third embodiments have been described based on cases where the AD converters included in the current detection circuits 100, 200 and 300, respectively, are successive-approximation AD converters, but the current detection circuits 100, 200 and 300 are not limited to successive-approximation AD converters. They may be, for example, flash AD converts as shown in FIG. 30 or ΔΣ type AD converters as shown in FIG. 31. Furthermore, the AD converters are not limited to a configuration to AD-convert a single-ended input voltage and they may be configured to AD-convert differential input voltages.

For example, a flash AD converter includes ladder resistors 107 provided between the reference voltage Vref and the ground voltage GND, plural comparators which compare the voltages at plural nodes provided on the ladder resistors R107 and the input voltage Vin, and an encoder which generates the digital signal Dout corresponding to the input voltage Vin based on the comparison results at the plural comparators. The ladder resistors R107 are provided as a resistive element R2 used to generate the reference voltage Vref.

Even though the foregoing first to third embodiments have been described based on cases in which the current detection circuits 100, 200 and 300 are applied to the current detection unit 12 included in the solenoid driver 11, the target of application of the current detection circuits 100, 200 and 300 is not limited to the current detection unit 12. The current detection circuits 100, 200 and 300 may be applied to any circuit required to detect an input current and convert the input current into a digital signal. Example cases of current detection circuit application will be described below.

(Application Example of Current Detection Circuit 100)

Figure 32:
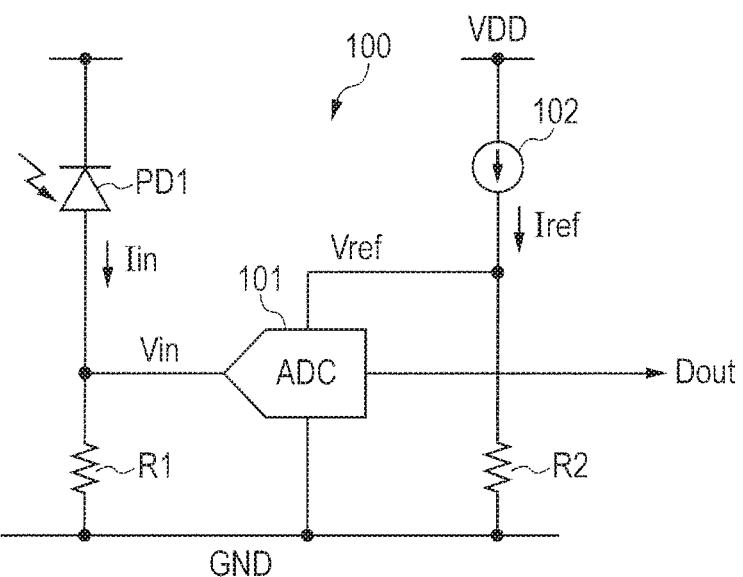
FIG. 32 is a circuit diagram showing a configuration example of a semiconductor device to which the current detection circuit of the first or second embodiment is applied.

FIG. 32 is a circuit diagram showing a configuration example of a semiconductor device 22 to which the current detection circuit 100 is applied. As shown in FIG. 32, the semiconductor device 22 includes a photodiode PD1 and the current detection circuit 100.

The photodiode PD1 converts irradiated light into a current Iin. The current detection circuit 100 outputs a digital signal Dout by converting the current Iin outputted from the photodiode PD1 into an input voltage Vin and AD-converting the input voltage Vin.

The current detection circuit 100 can detect with high accuracy the current Iin outputted from the photodiode PD1 and output the detected current In as a digital signal Dout.

(Application Example of Current Detection Circuit 300a)

Figure 33:
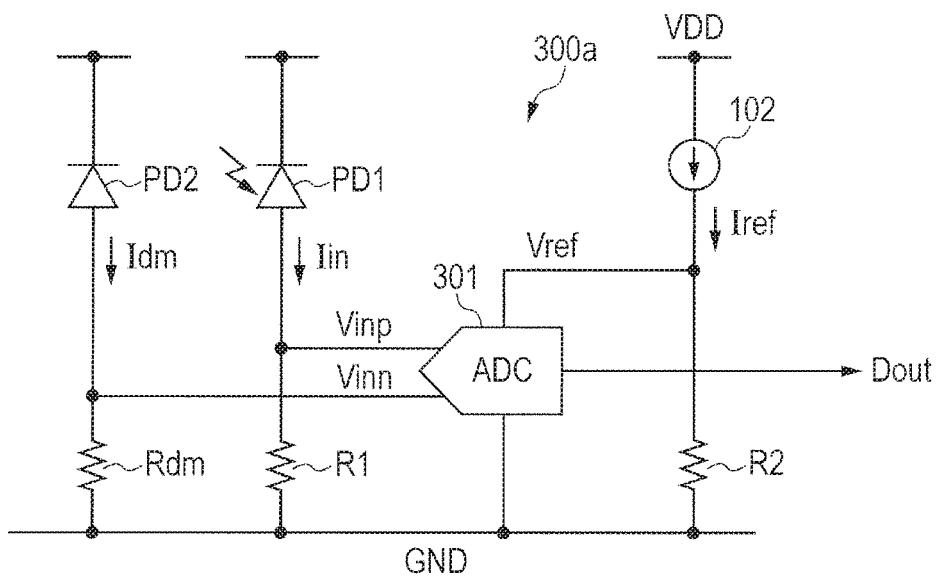
FIG. 33 is a circuit diagram showing a configuration example of a semiconductor device to which the current detection circuit of the third embodiment is applied.

FIG. 33 is a circuit diagram showing a configuration example of a semiconductor device 32 to which the current detection circuit 300a according to the third embodiment is applied. As shown in FIG. 33, the semiconductor device 32 includes photodiodes PD1 and PD2 and the current detection circuit 300a.

The photodiode PD1 converts irradiated light into a current Iinp. The photodiode PD2 outputs a current (dummy current) Iinn to flow when light irradiation is blocked (in cases with no light irradiation). The current detection circuit 100 converts the currents Iinp and Iinn outputted from the photodiodes PD1 and PD2 into input voltages Vinp and Vinn and, by AD-converting the input voltages Vinp and Vinn, outputs a digital signal Dout.

The current detection circuit 100d can detect, with high accuracy, the output current Iinp of the photodiode PD1 less a dark current and output the detected current as a digital signal Dout.

The photodiodes PD1 and PD2 preferably have the same operation characteristics between them. Then, it becomes possible to accurately subtract the dark current from the output current Iinp of the photodiode PD1.

Furthermore, in the configurations of the semiconductor devices according to the foregoing embodiments, the conductivity types (p type and n type) of the semiconductor substrates, semiconductor layers and diffusion layers (diffusion regions) may be inverted. Namely, in the semiconductor devices including two conductivity types, n and p, one as a first conductivity type and the other as a second conductivity type, either the first conductivity type may be the p type with the second conductivity type being the n type or, alternatively, the first conductivity type may be the n type with the second conductivity type being the p type.

What is claimed is:

1. A current detection circuit comprising:
a first resistive element which converts an input current supplied from outside into an input voltage;
a first constant-current source;
a second resistive element which converts an output current of the first constant-current source into a reference voltage; and
an AD converter which AD-converts the input voltage using the reference voltage,
wherein the first constant-current source comprises:
a first transistor which is provided between a supply voltage terminal and a ground voltage terminal and through which a first current flows;
a bipolar transistor which is provided between an output node of the first transistor and the ground voltage terminal and in which a base and a collector are coupled;
a fourth resistive element and a fifth resistive element which are provided to be in parallel with the bipolar transistor and to be in series between the output node of the first transistor and the ground voltage terminal;
a second transistor which supplies a second current proportional to the first current to a node between the fourth resistive element and the fifth resistive element and which is configured to allow on-resistance adjustment;
a third transistor and a sixth resistive element which are provided in series between the supply voltage terminal and the ground voltage terminal and which are configured to be capable of on-resistance adjustment;
an amplifier circuit which amplifies a potential difference between a voltage at a selected one of plural nodes on the fifth resistive element and a voltage at a node between the third transistor and the sixth resistive element and outputs a result of the amplification to a control terminal of the third transistor; and
a fourth transistor which outputs a current proportional to a current flowing through the third transistor as the reference voltage.

2. The current detection circuit according to claim 1, wherein the AD converter is a successive-approximation AD converter comprising:

a first DA conversion unit of a capacitor-array type which converts a digital signal into a first analog voltage using the reference voltage as a full-scale value;

a comparator which compares the first analog voltage and the input voltage; and a comparison control unit which outputs the digital signal corresponding to a result of comparison made by the comparator.

3. The current detection circuit according to claim 2, wherein the AD converter further comprises a second DA conversion unit of a resistor-string type, wherein the first DA conversion unit is configured to convert a first-part digital signal including a part of plural bits included in the digital signal into the first analog voltage, wherein the second DA conversion unit comprises:
  a ladder resistor provided between a node where the reference voltage appears and a node where a ground voltage appears; and
  a switch unit which, based on a second-part digital signal including a remainder of the plural bits included in the digital signal, selectively outputs a voltage at one of plural nodes provided on the ladder resistor as a second analog voltage, and wherein the comparator is configured to compare a composite voltage of the first analog voltage outputted from the first DA conversion unit and the second analog voltage outputted from the second DA conversion unit and the input voltage.

4. The current detection circuit according to claim 3, wherein a whole or a part of the second resistive element is, while being used to generate the reference voltage, also used as the ladder resistor.

5. The current detection circuit according to claim 2, wherein the AD converter further comprises a third DA conversion unit of a capacitor-array type which converts the digital signal into a second analog voltage using the reference voltage as a full-scale value, and wherein the comparator is configured to selectively compare the input voltage and one of the first analog voltage and the second analog voltage.

6. The current detection circuit according to claim 2, wherein the AD converter further comprises a third DA conversion unit of a capacitor-array type which converts the digital signal into a second analog voltage using the reference voltage as a full-scale value, wherein the first resistive element is configured to convert the input current into differential input voltages, and wherein the comparator is configured to compare one of the differential input voltages and the first analog voltage and also compare the other of the differential input voltages and the second analog voltage.

7. The current detection circuit according to claim 2, wherein the AD converter further comprises:
  a third DA conversion unit of a capacitor-array type which converts the digital signal into a second analog voltage using the reference voltage as a full-scale value; and
  a third resistive element, wherein the first resistive element converts the input current into one of differential input voltages, wherein the third resistive element converts a second input current into the other of the differential input voltages, and wherein the comparator is configured to compare the one of the differential input voltages and the first analog voltage and also compare the other of the differential input voltages and the second analog voltage.

8. The current detection circuit according to claim 1, further comprising a first voltage follower which outputs the reference voltage at a same potential, wherein the AD converter is configured to AD-convert the input voltage using the reference voltage outputted from the first voltage follower.

9. The current detection circuit according to claim 1, further comprising a second voltage follower which outputs the input voltage at a same potential, wherein the AD converter is configured to AD-convert the input voltage outputted from the second voltage follower.

10. The current detection circuit according to claim 1, further comprising:
  a first voltage follower which outputs the reference voltage at a same potential and
  a second voltage follower which outputs the input voltage at a same potential, wherein the AD converter is configured to AD-convert the input voltage outputted from the second voltage follower using the reference voltage outputted from the first voltage follower.

11. The current detection circuit according to claim 1, wherein the first resistive element and the second resistive element are positioned adjacently to each other.

12. The current detection circuit according to claim 1, wherein the first resistive element and the second resistive element are configured to be identical in operation characteristics.

13. A semiconductor device comprising:
  a first photodiode which converts irradiated light into a current and
  the current detection circuit according to claim 1 to which current outputted from the first photodiode is inputted.

14. The semiconductor device according to claim 13, further comprising a second photodiode processed for irradiation blocking, wherein the current detection circuit further comprises a third resistive element which converts a current outputted from the second photodiode into a dummy voltage, and wherein the AD converter is configured to AD-convert differential input voltages including the input voltage and the dummy voltage.

15. The semiconductor device according to claim 14, wherein the first photodiode and the second photodiode are configured to have identical operation characteristics.

16. A semiconductor device, comprising:
  a sense transistor through which a current flows, the current being proportional to a current flowing through a drive transistor to control a supply of current to flow through a load; and
  the current detection circuit according to claim 1 to which the current flowing through the sense transistor is inputted as the input current.

17. The semiconductor device according to claim 16, further comprising:
  a second constant-current source which adds a predetermined amount of current to the current flowing through the sense transistor; and
  a subtractor which subtracts an amount of variation attributable to the predetermined amount of current from a result of AD conversion made by the AD converter included in the current detection circuit, wherein, to the current detection circuit, a sum of the current flowing through the sense transistor and the predetermined amount of current is inputted as the input current.

18. A semiconductor system comprising:
a drive transistor which controls, based on a pulse signal, supply of current to flow through a load;
a current detection unit which indirectly detects current flowing through the drive transistor; and
a control circuit which controls a duty ratio of the pulse signal based on a result of current detection by the current detection unit,
wherein the current detection unit comprises:
a sense transistor through which a current proportional to the current flowing through the drive transistor flows; and
the current detection circuit according to claim 1 to which the current flowing through the sense transistor is inputted as the input current.

19. The semiconductor system according to claim 18, wherein the load is a solenoid valve.

\* \* \* \* \*